United States Patent [19]

Schnitta

[11] Patent Number: 5,402,520
[45] Date of Patent: Mar. 28, 1995

[54] NEURAL NETWORK METHOD AND APPARATUS FOR RETRIEVING SIGNALS EMBEDDED IN NOISE AND ANALYZING THE RETRIEVED SIGNALS

[76] Inventor: Bonnie S. Schnitta, 29 Gann Rd., East Hampton, N.Y. 11927

[21] Appl. No.: 847,776

[22] Filed: Mar. 6, 1992

[51] Int. Cl.[6] ............................................. G01L 7/08
[52] U.S. Cl. ...................................... 395/22; 395/21; 395/2.35; 395/2.42
[58] Field of Search ................ 395/22, 24, 2, 27, 2.35, 395/2.42, 21

[56] References Cited

U.S. PATENT DOCUMENTS

| | | | |
|---|---|---|---|
| 4,188,667 | 2/1980 | Graupe et al. | 364/724 |
| 4,751,663 | 6/1988 | Yamazaki | 364/724 |
| 4,817,180 | 3/1989 | Cho et al. | 382/54 |
| 4,937,872 | 6/1990 | Hopfield et al. | 381/43 |
| 4,979,126 | 12/1990 | Pao et al. | 364/513 |
| 4,980,849 | 12/1990 | Baseghi | 364/724.17 |
| 4,984,187 | 1/1991 | Graybill | 364/724.17 |
| 5,014,232 | 5/1991 | Andre | 364/724.19 |
| 5,031,132 | 7/1991 | Dolazza | 364/724.12 |
| 5,040,215 | 8/1991 | Amano et al. | 381/43 |
| 5,046,019 | 9/1991 | Basehore | 364/513 |
| 5,048,100 | 9/1991 | Kuperstein | 382/36 |
| 5,058,184 | 10/1991 | Fukushima | 382/37 |
| 5,060,278 | 10/1991 | Fukumizu | 382/14 |
| 5,063,521 | 11/1991 | Peterson et al. | 395/27 |
| 5,067,095 | 11/1991 | Peterson et al. | 395/24 |
| 5,092,343 | 3/1992 | Spitzer et al. | 395/22 |
| 5,105,468 | 4/1992 | Guyon et al. | 395/22 |
| 5,121,443 | 6/1992 | Tomlinson | 382/14 |
| 5,136,687 | 8/1992 | Edelman et al. | 395/21 |
| 5,148,385 | 9/1992 | Frazier | 395/27 |
| 5,181,171 | 1/1993 | McCormack et al. | 395/22 |
| 5,185,848 | 2/1993 | Aritsuka et al. | 395/22 |
| 5,201,029 | 4/1993 | Jackson | 395/27 |
| 5,212,767 | 5/1993 | Higashino et al. | 395/11 |

OTHER PUBLICATIONS

Ydstie, B. E.; "Forcasting and Control Using Adaptive Connectionist-Networks"; Computers Chem Engng; vol. 14, No. 4.5 pp. 583–599, 1990.
D. Fletcher, B. Schnitta-Israel, J. Dorman, J. Acoust. Soc. Am. 73(1) p. 230 1/83.
B. Schnitta—Israel, J. Sherry, AFOSR/DARPA Contract F49620-83-C-0137 2/84.
B. Schnitta-Israel, IEEE Trans. on Sonics and Ultras. SU-31(4) p. 391 7/84.
B. Widrow, R. Winter, Computer, p. 25 3/88.
B. Schnitta-Israel & R. S. Freedman, "Increasing the Usefulness . . . " Agard Conference Proceedings No. 414 1986.
A. Lindenmayer & P. Rusinkiewicz, The Algorithmic Beauty of Plants (Springer-Verlag, New York), Chap. 8 1990.

*Primary Examiner*—Robert W. Downs
*Assistant Examiner*—Tariq R. Hafiz
*Attorney, Agent, or Firm*—Kenyon & Kenyon

[57] ABSTRACT

An apparatus for retrieving signals embedded in noise and analyzing the signals. The apparatus includes an input device for receiving input signals having noise. At least one noise filter retrieves data signals embedded in the input signals. At least one adaptive pattern recognition filter generates coefficients of a polynomial expansion representing the pattern of the filtered data signals. A storage device stores the coefficients generated. It is determined when an event has occurred, the event being located at any position within the data signals. An adaptive autoregressive moving average pattern recognition filter generates coefficients of a polynomial expansion representing an enhanced pattern of filtered data signals. At least one weighting filter compares the stored patterns with the enhanced pattern of data signals.

33 Claims, 14 Drawing Sheets

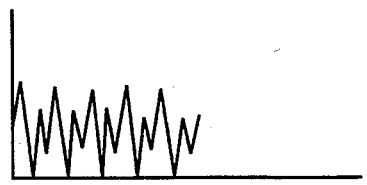
FIG. 11A
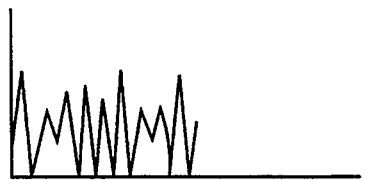
FIG. 11B
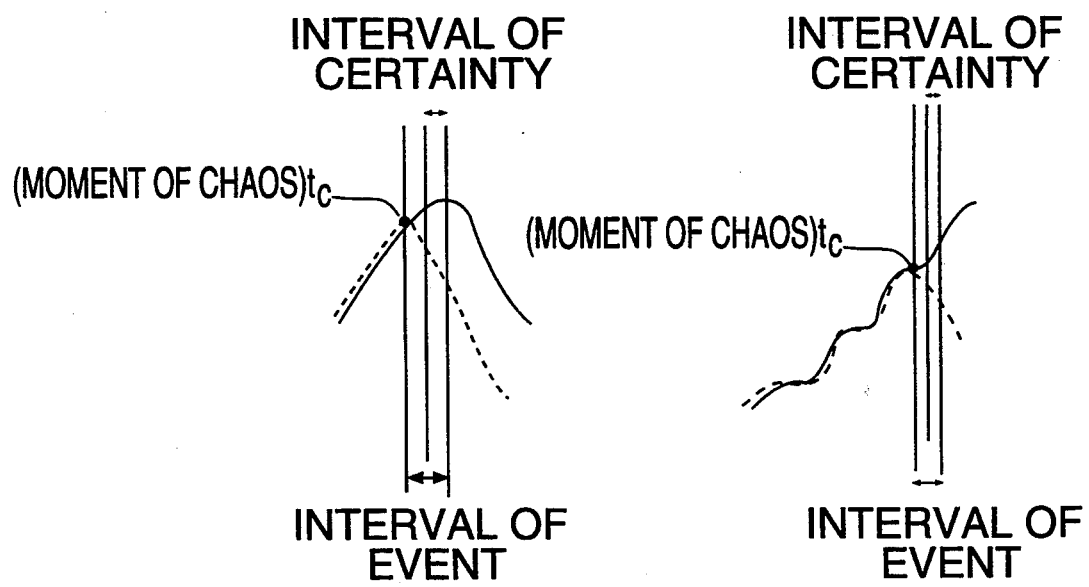
FIG. 12A
FIG. 12B

NEURAL NETWORK METHOD AND APPARATUS FOR RETRIEVING SIGNALS EMBEDDED IN NOISE AND ANALYZING THE RETRIEVED SIGNALS

BACKGROUND OF THE INVENTION

Field of the invention

This invention relates to apparatus and method incorporating a neural network for retrieving signals embedded in noise and analyzing the retrieved signals. In a first stage, the noise is filtered out of the input signal to retrieve a filtered data signal. In a second stage, the filtered data signals are analyzed to determine their behavior. In a third stage, the significance of the behavior of the signals is determined. The apparatus and method of the invention are usable in a variety of applications where signals are embedded in noise, including, without limitation, earthquake and other seismic data, stock market data (including stocks, options, futures, commodities, currencies, indices, foreign government and municipal securities, bonds, treasury bills, foreign exchange rates, interest rates), high definition television signals, radar, sonar, ultrasound imaging, edge detection, detection of presence of certain elements, such as lead, from x-rays of the bone, and the like.

The present invention is preferably implemented using a computer and a digitized data processor. In a preferred embodiment of the present invention, the computer receives stock market data input signals, learns the pattern of signals to predict future behavior, identifies deviations from the learned patterns, analyzes the deviations in view of previously stored patterns of stock market behavior, and ultimately identifies the meaning of the deviations, such as profitable buy/sell selections in the stock market.

The present invention includes a filter to filter out noise and focus on what is essential in the market. The filter separates from the chaos of the market those activities which indicate a trend. The present invention further includes a neural network that has learned and will continue to learn stock market data behavior. The neural network applies learned patterns to incoming data to identify and recommend possible highly profitable buy/sell selections that may or may not follow the learned patterns. The present invention includes an expert system which prioritizes the recommended buy/sell selections.

It is useful to analyze signals embedded in noise, such as stock market data, using a neural network for the following reasons: (1) unlike traditional expert systems where knowledge is represented explicitly in the for of rules, neural networks can learn from examples; (2) neural networks have the ability to recognize patterns in data and classify incoming data into previously learned examples or trained pattern sets; and (3) neural networks are known for their ability to learn from experience, to generalize, and to recognize and predict patterns.

The neural network portion of the apparatus and method of the present invention includes a self adaptive and variant error ("SAVE") filter. The SAVE filter views the incoming data prior to the onset of a signal of potential interest from a simple quadratic error filter. Once the signal of potential interest impinges the system of the present invention, as identified by the error:

1. the coefficients related to the data prior to the signal are "frozen";
2. the filter becomes an adaptive autoregressive moving average ("ARMA") filter; and
3. the usual nonlinearities of an adaptive ARMA are avoided, since the "frozen" coefficients retain the mathematics within the quadratic regime.

The SAVE filter provides determination of:
1. the optimum approach to freezing the coefficients;
2. the optimum filter lengths for each portion of the filter;
3. the optimum adaptation time associated with each portion of the SAVE filter; and
4. improved signal detector, identification, and pattern recognition after determining (1) through (3).

SUMMARY OF THE INVENTION

The invention will be summarized with reference to FIG. 1. Let $S(0,n)$ represent the array of values of a data signal from $S(n)$, the location or moment of interest such as the present place or time, to $S(0)$, the value of the data signal n intervals away in location or time. For example, $S(0,n)$ could be stock price as a function of time and the time interval could be anything from the interval of each trade to a trading day. For simplicity, such an array $S(0,n)$ is represented by a data signal S in the drawings.

In a preferred embodiment, one or more arrays of related or discriminant signals $D_n(0,n)$ my also be processed by the system. For example, $D_1(0,n)$ could be stock volume as a function of time. For simplicity such an array $D_n(0,n)$ is represented by a discriminant signal $D_n$ in the drawings.

An array of noisy data signals $S_0(0,n)$ is input to a noise filter unit 1 comprising at least one, preferably more than one, and most preferably three, noise filters $F_1, F_2, F_3, \ldots, F_N$ to generate a corresponding number of filtered data signal arrays $S_1(0,n), S_2(0,n), S_3(0,n), \ldots, S_N(0,n)$. One or more arrays of noisy discriminant signals $D_{0n}(0,n)$ are similarly processed in the noise filter unit 1 to generate filtered discriminant signal arrays $D_{1n}(0,n), D_{2n}(0,n), D_{3n}(0,n), \ldots, D_{Nn}(0,n)$.

The one or more filtered data signal arrays $S_1(0,n), S_2(0,n), S_3(0,n), \ldots, S_N(0,n)$ and the one or more filtered discriminant signal arrays $D_{1n}(0,n), D_{2n}(0,n), D_{3n}(0,n), \ldots, D_{Nn}(0,n)$ output from the noise filter unit 1 are then input to a "chaos identifier" neural network comprising at least one and preferably more than one processing stages.

In the first stage, the one or more filtered data signals are input to an adaptive pattern recognition unit 2 comprising at least one and preferably two neural network systems $F_A, F_B, \ldots, F_X$, that can adaptively learn a pattern representing the filtered data signals and use this learned pattern to predict the value of future data signals. Each neural network system $F_A, F_B, \ldots, F_X$, learns a pattern $P_{1A}(0,n-1), \ldots, P_{NA}(0,n-1), P_{1B}(0,n-1), \ldots, P_{NB}(0,n-1), \ldots, P_{1X}(0,n-1), \ldots, P_{NX}(0,n-1)$ that is a function of each of the filtered data signals $S_1(0,n-1), S_2(0,n-1), S_3(0,n-1), \ldots, S_N(0,n-1)$. These patterns $P_{1A}(0,n-1), \ldots, P_{NX}(0,n-1)$ are stored in memory and optionally may be output to an output device.

The at least one learned patterns output by the pattern recognition unit 2 of the chaos identifier neural network namely patterns $P_{1A}(0,n-1), \ldots, P_{NX}(0,n-1)$, together with the one or more filtered data signal arrays $S_1(0,n), S_2(0,n), S_3(0,n), \ldots, S_N(0,n)$ and the one or more filtered discriminant signal arrays $D_{1n}(0,n)$, $D_{2n}(0,n)$, $D_{3n}(0,n)$, ..., $D_{Nn}(0,n)$, are then input to an event identifying unit 3, which includes the second and third stages of the chaos identifier neural network.

In the second stage of the chaos identifier, the event identifying unit 3 calculates the errors, $\epsilon_{1A}, \ldots, \epsilon_{NX}$, between the actual values of $S_1(n), \ldots, S_N(n)$ and the predicted values, $[S_1(n), \ldots, S_N(n)] S_1(n), \ldots, S_N(n)$. [which are predicted from the patterns $P_{1A}(0,n-1), \ldots, P_{NX}(0,n-1)$.] If any of these errors exceeds a small specified amount $\delta$, say $\epsilon_{1A} > \delta$, then an event is flagged and a flag F may optionally be output to an output device.

In the third stage of the chaos identifier, the event identifying unit 3 ascertains the exact moment of chaos, $t_c$. While the discriminant signals $D_{Nn}$ can be processed as a signal and evaluated for their error, in this preferred embodiment, the discriminants are not subjected to error evaluation, rather they are used as an aid in choosing the exact moment of chaos. The resultant signals are used to form patterns $R_{Ni}$. These patterns $R_{Ni}$, if deemed unique or highly representative, optionally may be output to an output device. These representative patterns $R_{Ni}$ are preferably stored in a pre-existing vault of patterns R for later use.

The filtered data signals $S_{1A}, \ldots, S_{NX}$, each with its respective identified moment of chaos, $t_{c1A}, \ldots, t_{cNX}$, the pre-moment of chaos patterns $P_{NX}$, the representative patterns $R_{Ni}$ with the enhanced post-moment of chaos data signals, and the discriminant signals $D_{1n}, \ldots, D_{Nn}$ are sent to a pattern recognition system unit 4. The pattern recognition system learns adaptively from experience and separates various discriminants from the unrelated or attenuating factors. The unit 4 consists of at least one, preferably more than one, and most preferably three, pattern recognition systems, at least one of which generalizes the signal pattern $R_{Ni}$, for $i>0$, in a pattern vault and chooses the stored pattern $R_{NX}$ which most easily generalizes to the signal pattern $R_{Ni}$ and assigns weights $W_{NX}$ to the precision of the fit of $R_{Ni}$ to $R_{NX}$. The output from unit 4 comprises $R_{NXM}$, $W_{NXM}$.

The resultant chosen patterns $R_{NXM}$ and their associated weights $W_{NXM}$ are input to an expert system unit 5. The expert system, using a set of rules, determines, given the $R_{NXM}$ and $W_{NXM}$, which signals qualify for any specified category $C_f$ and assigns a composite weight $W_f$ to the category $C_f$. These could be stocks for buy or sell, or lead in a bone from an x-ray fluorescence device. These outputs optionally may be processed through a ranking unit which rearranges the categories $C_f$ according to $R_{NXM}$, $W_{NXM}$, and $W_f$, using, but not limited to, such a strategy as case-based reasoning. The results are output to an output device.

BRIEF DESCRIPTION OF THE DRAWINGS

Other objects, features, and advantages of the present invention will occur to those skilled in the art from the following description of a preferred embodiment and the accompanying drawings, in which:

FIGS. 11A and 11B are depictions of hypothetical signals without and with chaos, respectively.

FIGS. 12A through 12C are depictions of hypothetical signals and corresponding patterns illustrating the interval of an event and the exact moment of chaos.

FIG. 13A is a circuit diagram of a pure autoregressive filter, while

DESCRIPTION OF THE PREFERRED EMBODIMENTS OF THE INVENTION

The preferred embodiment of the present invention will be described in terms of a method ! and apparatus for analyzing stock market activities. The data signal input to the system $S_0$ will be stock price as a function of time t. For the sake of simplicity, $S_0$ will designate $S_0(t)$, unless otherwise specified. Because of the wide range of stock prices, the input signals $S_0$ are preferably normalized prior to analysis. Normalization may be from $1-10 or $1-20 or any other desired range.

In a preferred optional embodiment, the trading volume of each stock of interest is monitored and analyzed in addition to the price of that stock. Thus, the optional discriminant signal $D_0$ input to the system will be stock volume as a function of time t. Again for simplicity, $D_0$ will designate $D_0(t)$. While other discriminants, such as high/low, bid/ask, etc., can be used to improve results, just volume is used to illustrate the use of the discriminants. The discriminant(s) can also be normalized.

Noise Filtering

Figure 1:
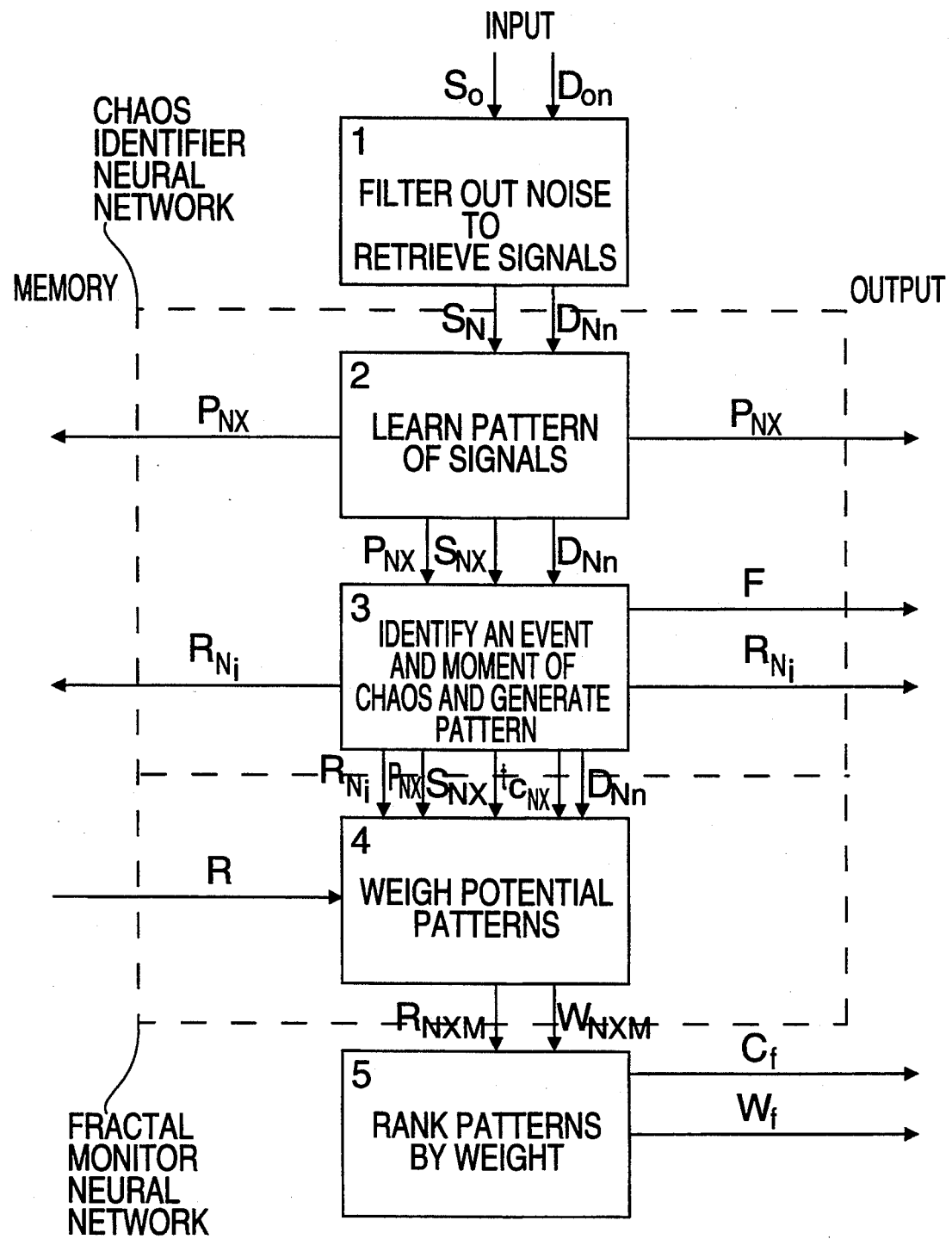
FIG. 1 is a schematic diagram illustrating the flow of signals through the apparatus and method of the present invention.
Figure 2:
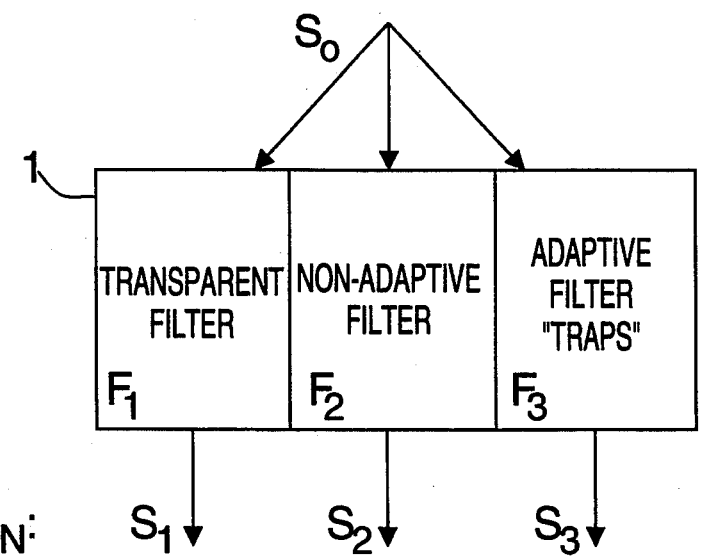
FIG. 2 is a schematic diagram of the noise filter unit 1 for filtering out noise to retrieve signals.

As shown in FIGS. 1 and 2, noisy data signals $S_0$ are input to a noise filter unit 1 comprising at least one, preferably more than one, and most preferably three, noise filters $F_1, F_2, F_3, \ldots, F_N$ to generate a corresponding number of filtered data signals $S_1, S_2, S_3, \ldots, S_N$.

The noise filter unit 1 in FIGS. 1 and 2 preferably comprises three filters $F_1, F_2, F_3$ as shown in FIG. 2. The first filter $F_1$ is a transparent filter; it passes an input data signal $S_0$ unchanged for output as data signal $S_1$. The second filter $F_2$ is a non-adaptive noise filter. Filter $F_2$ performs a pure mathematical subtraction of the variation of the relevant universe (in this example, it could be the average price change of a share of stock for the stock market or the Dow Jones Industrial Average (DJIA) or the average price of biotechnology stocks) from the variation in the input signal $S_0$ an individual stock price versus time). The output from filter $F_2$ is filtered data signal $S_2$. The third filter $F_3$ is an adaptive noise ("TRAPS") filter which filters out the noise of the universe itself (e.g., the stock market) to produce a filtered data signal $S_3$. Filter $F_3$ is discussed in more detail below.

Like the price signal $S_0$, the volume signal $D_0$ is passed through the transparent filter $F_1$ and the non-adaptive (pure mathematical) noise filter $F_2$. When the discriminant is best represented by a pattern, as opposed to differences, it can also be passed through the adaptive (TRAPS) noise filter $F_3$. The filtered volume signals $D_1$, $D_2$, $D_3$ are then passed directly to the event identifying unit 3.

The adaptive noise filter $F_3$ operates by comparing the desired response signal $\hat{x}(n)$ to the input signal $x(n)$ and minimizing the error $\epsilon(n)$. The filter $F_3$ constantly adapts the desired response signal based on the input signal, so that it constantly learns the signals and refines the algorithm relating the response signal to the input signal. There are a variety of ways to obtain the desired response signal.

Figure 3A:
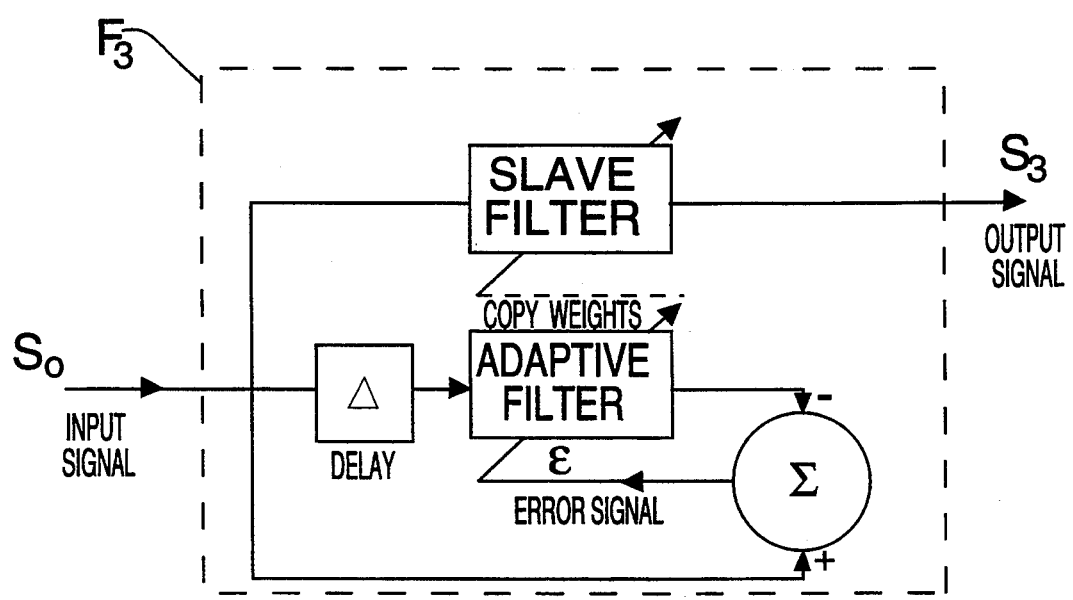
FIGS. 3A through 3C are circuit diagrams illustrating various embodiments of an adaptive noise filter $F_3$.

One such way, which is also referred to as statistical prediction, is to use a time-delayed input signal as the actual signal and the undelayed signal as the desired response signal. In such a system, the input signal delayed by t time units is fed to the adaptive filter. The undelayed input serves as the desired response for the adaptive filter. The filtered time-delayed input signals are compared to the desired response signals to generate an error signal which, in turn, is applied as input to the adaptive filter. The adaptive filter weights for the signals adapt and converge to produce a best (weighted) LMS estimate of the present input signal. The (optional) weights providing the best LMS fit are copied into a slave filter. This slave filter then operates on the undelayed input signal to produce an output signal which is a prediction of the input signal t time units into the future. An example of such a filter is illustrated in FIG. 3A. Further discussion of such a filter is found in B. Widrow & R. Winter, "Neural Nets for Adaptive Filtering and Adaptive Pattern Recognition," *Computer*, March 1988, p. 25, which is hereby incorporated by reference in its entirety.

An alternative method, known as noise cancellation, can be performed in cases where a reference input containing noise $n_1$, which is correlated with the signal noise $n_0$, is available. In this example, the reference input might be the DJIA. In such a case the primary input $S_0$, consists of the "true" signal x plus noise $n_0$ and the reference input is the noise $n_1$. The primary input is used as the desired signal, and the reference input is passed to the adaptive filter. The adaptive filter produces a noise cancelling signal y which is applied to and compared to the desired response signals to generate an error signal $\epsilon = x + n_0 - y$, which is applied as input to the adaptive filter. Squaring and taking the expectation value yields $$E(\epsilon^2) = E(x^2) + E[(n_0 - y)^2] + 2E[x(n_0 - y)]. \quad (1)$$

Since x is uncorrelated with either $n_0$ or y, the last term drops out, leaving $$E(\epsilon^2) = E(x^2) + E[(n_0 - y)^2]. \quad (2)$$

The adaptive filter is adapted to minimize the error without affecting the signal, namely $$E_{min}[\epsilon^2] = E[x^2] + E_{min}[(n_0 - y)^2]. \quad (3)$$

Figure 3B:
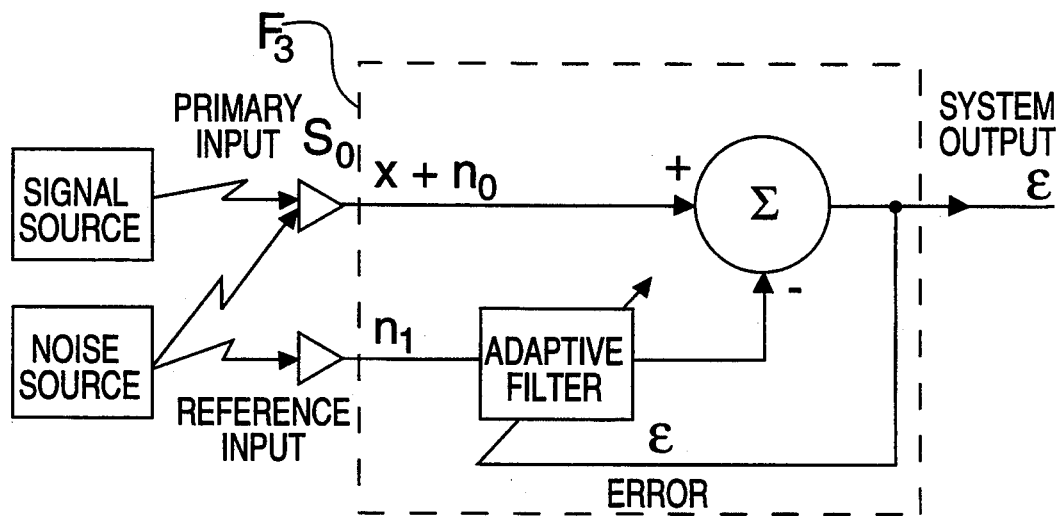

An example of such a filter is illustrated in FIG. 3B. Further discussion of such a filter is found in B. Widrow & R. Winter, "Neural Nets for Adaptive Filtering and Adaptive Pattern Recognition," *Computer*, March 1988, p. 25, which is hereby incorporated by reference in its entirety.

In the present example, where it is desired to filter out the noise of the universe, i.e. the stock market, then the "reference" noise signal may be drived from a cumulation of individual noisy signals. Let $$x(n) = x(t_n) = x(n\Delta t); \ n = 0, 1, \quad (4)$$

denote a variable excluding ambient noise, such as price of a given stock, as a function of time. This variable will be modeled as the output of a linear recursive system. The variable will be subject to ambient noise, from, in this example, the stock market. The ambient noise sampled over time is assumed to be a transient autoregressive sequence. Analysis of the ambient noise requires the following assumptions: (1) there is a dominant autoregressive (AR) component u(n); (2) this component is stationary or at worst slowly varying; and (3) an adaptive least-mean-square (LMS) filter with appropriate parameters converges to (and tracks) this component.

First, let the actual measurements y(n) be written as $$y(n) = z(n) + u(n), \quad (5)$$

where u(n) satisfies the ambient equation $L[\underline{u}(n))] = w(n)$ and z(n) is the residual component not satisfying this equation. L is the autoregressive operator acting on the vector of data values $\underline{u}(n)$ known at time n, and w(n) is the excitation variable, which, by assumption (2) above, will be assumed to be essentially white noise.

Next, define the error function $\epsilon(n) = L[\underline{y}(n)]$. Then $$\epsilon(n) = x(n) + w(n), \quad (6)$$

where $x(n) = L[\underline{z}(n)]$ is "transient" autoregressive. The adaptive least-mean-square (LMS) filter constructs a sequence of coefficients $[a_j(n)]$ which converges to the true coefficients as n goes to infinity. Then the predicted value can be written as $$\hat{x}(n) = \sum_{j=1}^{L} a_j(n) x(n - j), \quad (7)$$

so that $$a_j(n+1) = a_j(n) + \mu \delta(n) x(n-j), \quad (8)$$

where $\delta(n) = x(n) - \hat{x}(n)$, and the parameter $\mu$ controls the adaptation time of the adaptive AR filter.

Figure 3C:
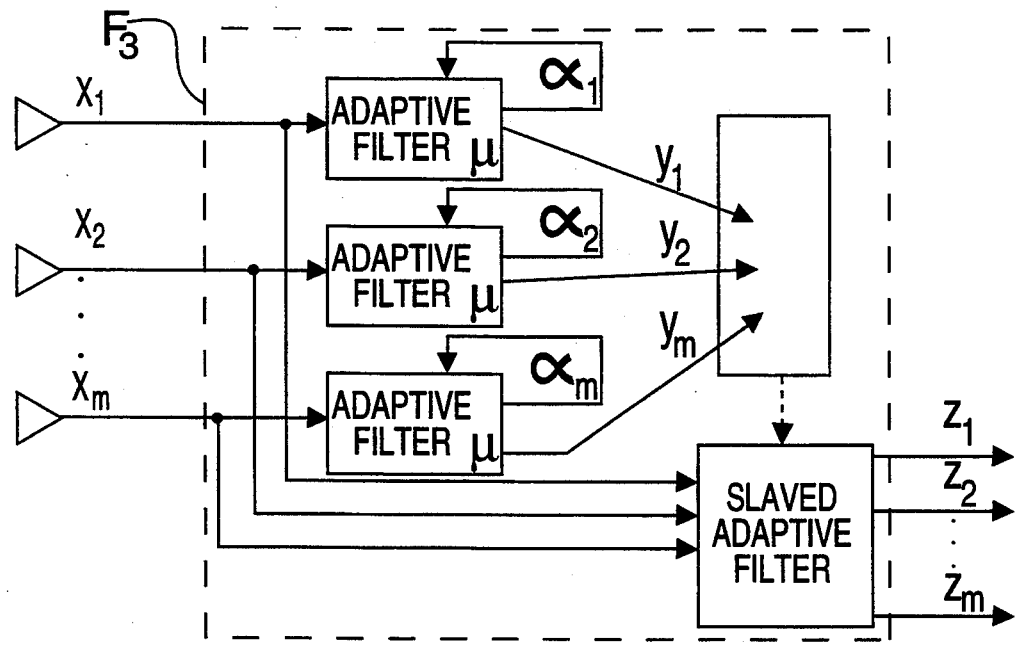

An example of such a filter, namely a Transient Acoustic Processing System ("TRAPS"), is illustrated in FIG. 3C. Further discussion of such a filter is found in B. Schnitta-Israel & J. Sherry, "Nuclear Monitoring, using a Hybrid Adaptive Processing System, Traps I," Feb. 14, 1984, and in D. Fletcher, B. Schnitta-Israel & J. Dorman, "Hybrid adaptive filtration for seismic event location," *J. Acoust. Soc. Am.* 73(1), January 1983, p. 230, both of which are hereby incorporated by reference in their entireties.

The "Chaos Identifier" Neural Network

Figure 4:
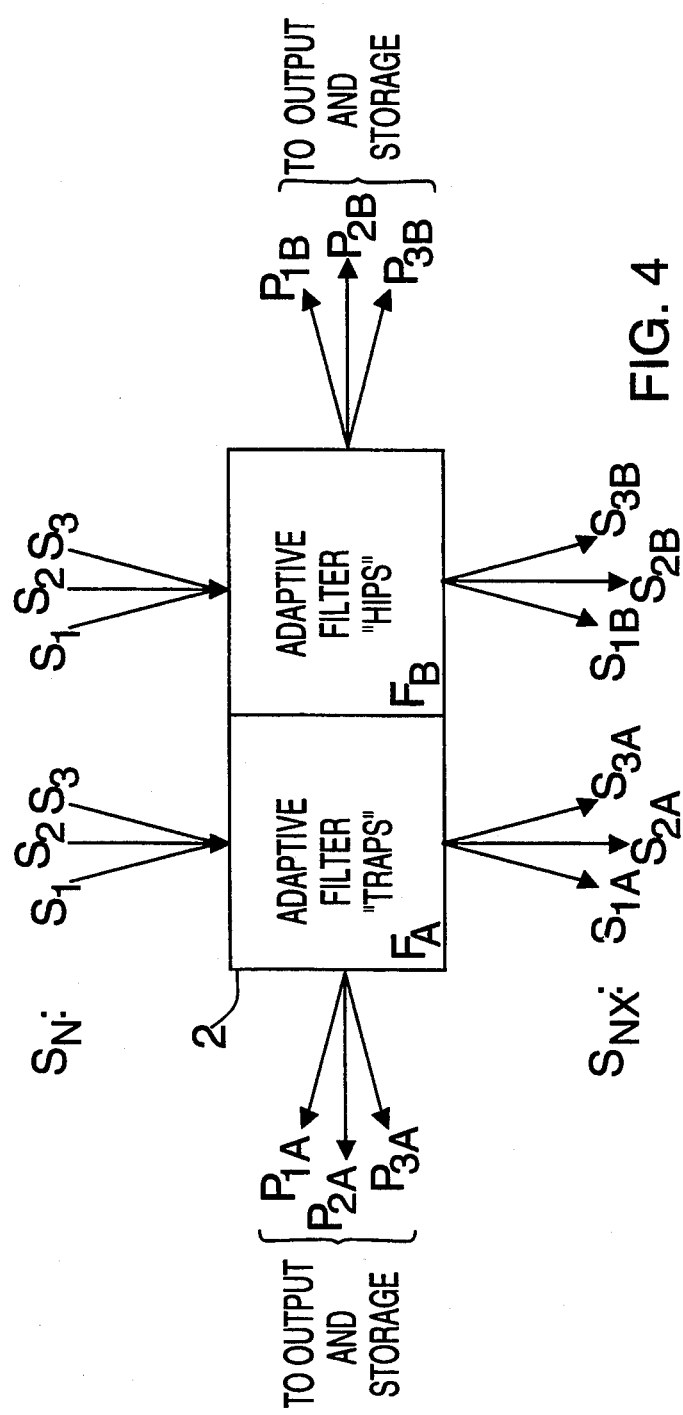
FIG. 4 is a schematic diagram of the adaptive pattern recognition unit 2 for learning a pattern of signals.

As shown in FIGS. 1 and 4, each of the at least one filtered data signals $S_1, S_2, S_3, \ldots, S_N$ and their discriminants $D_1, D_2, \ldots, D_N$ from the at least one filters $F_1, F_2, F_3, \ldots, F_N$ are then passed to the adaptive pattern recognition unit 2 of the "chaos identifier" neural network.

Learning Stocks

The first stage of the chaos identifier neural network is to "learn" the stocks using an adaptive pattern recognition filter. As shown in FIG. 4, the one or more filtered data signals are input to an adaptive pattern recognition unit 2 comprising at least one and preferably two neural network systems $F_A, F_B, \ldots, F_X$ that can adaptively learn a pattern representing the filtered data signals and use this learned pattern to predict the value of future data signals. Each neural network system $F_A, F_B, \ldots, F_X$ learns a pattern $P_{1A}, \ldots, P_{NA}, P_{1B}, \ldots, P_{NB}, \ldots, P_{1X}, \ldots, P_{NX}$ that is a function of each of the filtered data signals $S_1, S_2, S_3, \ldots, S_N$. These patterns $P_{1A}, \ldots, P_{NX}$ are stored in a memory device (not shown) and optionally may be output to an output device (not sown).

Figure 5:
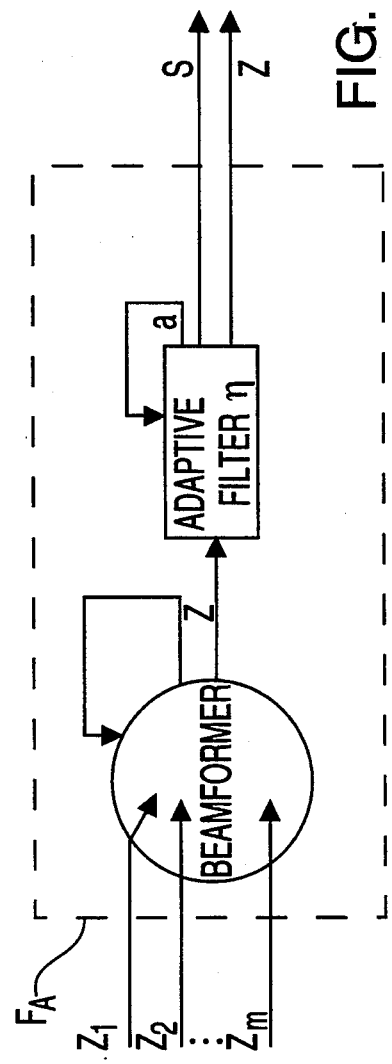
FIG. 5 is a circuit diagram illustrating one embodiment of an adaptive pattern recognition filter $F_A$ ("TRAPS").

The exemplary unit 2 shown in FIG. 4 has as a first adaptive pattern recognition filter $F_A$ a hybrid AR filter, such as the "TRAPS" filter discussed above, and further illustrated in FIG. 5, in which the signals are subject to signal enhancement, as follows.

Returning now to Equations (1) through (8), combining the modeling for the individual stocks yields $$\hat{z}(n) = \sum_{m=1}^{M} a_m(n) z(n-m), \quad (9)$$

where $a_m(n+1) = a_m(n) + \eta z(n-m)[\hat{z}(n) - z(n)]$. The error function $\epsilon$ can then be written as $$\epsilon = \hat{z}(n) - z(n). \quad (10)$$

The parameter $\eta$ controls the adaptation times of the adaptive AR filter.

Figure 6:
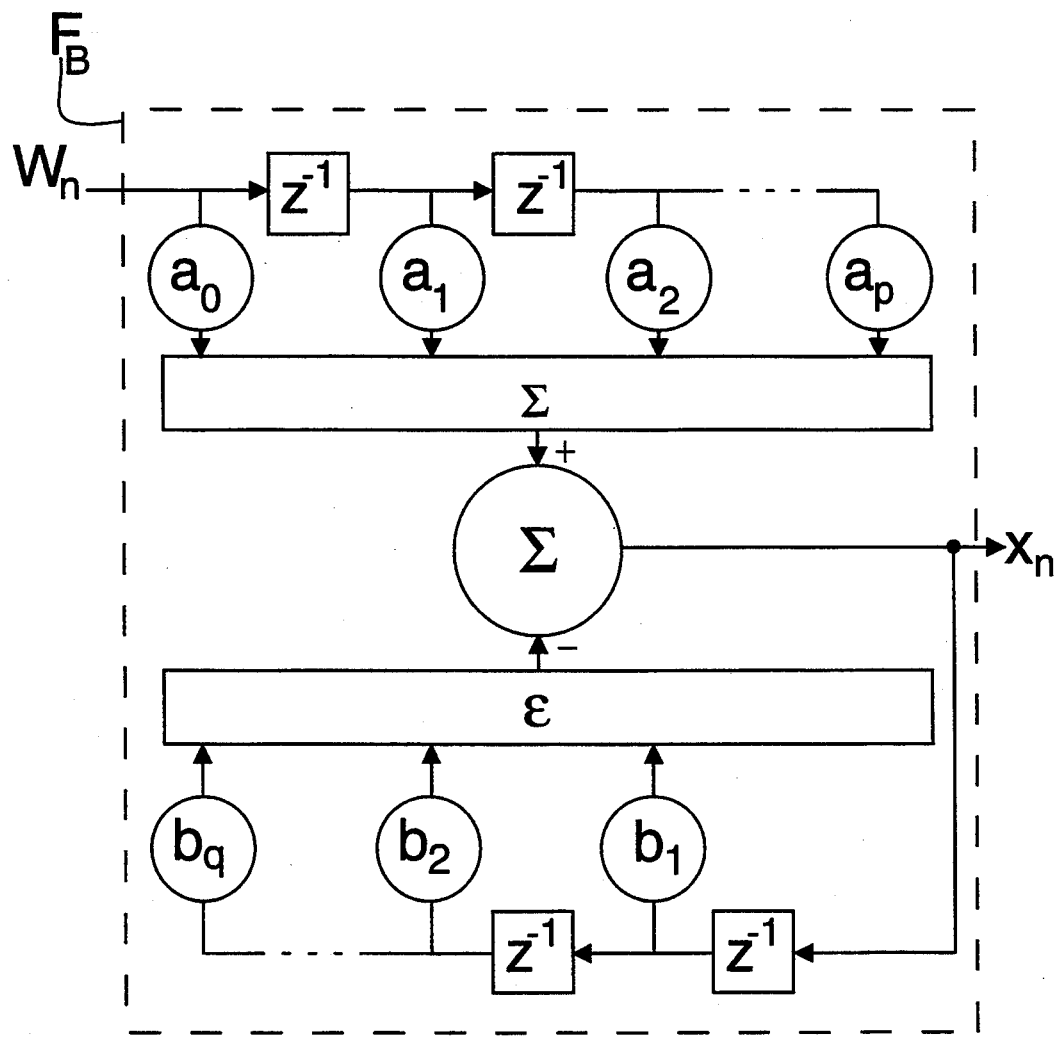
FIG. 6 is a circuit diagram illustrating one embodiment of an adaptive pattern recognition filter $F_B$ ("HIPS").

The independent adaptive filters for each stock m will converge to the ambient operator $L_m$ for that stock. The resulting noise sequences $w_m(n)$ will be independent, which permits maximum signal-to-noise ratio (SNR), when the sequences $\delta_m(n)$ are combined. The second adaptive pattern recognition filter $F_B$ of exemplary unit 2 in FIG. 4 is an autoregressive moving average (ARMA) filter, such as the "HIPS" filter discussed in B. Schnitta-Israel, "Hybrid Image Processing System (HIPS) by Means of an Adaptive Autoregressive Moving Average Algorithm," *IEEE Transactions on Sonics and Ultrasonics*, SU-31(4), July 1984, p. 391, which is hereby incorporated by reference in its entirety, and further illustrated in FIG. 6.

$$x(n) - \sum_{i=1}^{p} a_i x(n-i) = \sum_{i=0}^{q} b_i W(n-i) \quad (11)$$

in which $x(n)$ is the desired signal response series and $W(n)$ is the excitation series. Taking the z transform yields:

$$X(z) = \frac{B(z)}{A(z)} \hat{W}(z) \quad (12)$$

where $A(z)$ and $B(z)$ are p, q degree polynomials in z and $W(z)$ is the transform of the series $W(n)$. Thus, the observed series $x(n)$ is considered to be the output of a filter with a transfer function $H(z) = B(z)/A(z)$ and input $W(n)$.

In contrast to an adaptive AR process in which the equations to be solved would be quadratic in nature and easily solvable, adaptive ARMA processes tend to be unstable. Thus, the adaptive ARMA requires a method which remains stable within the process of solving the nonlinear equations without requiring excessive computer time.

Accordingly, the model of Equation (11) is rewritten in two parts as follows:

$$\text{I:} \quad e(n) = x(n) - \sum_{i=1}^{p} a_i x(n-i) \quad (13)$$

and $$\text{II:} \quad \sum_{i=0}^{q} b_i W(n-i) = e(n) \quad (14)$$

The sum in the first part I (Equation (13)) can be thought of as representing an isolated stock, whereas the sum in the second part II (Equation (14)) can be thought of as representing the trend of the market or, where the noise of the market has been removed by filtering, as representing the trend of the industry.

An estimate $\hat{e}(n)$ for the series $e(n)$ is initially calculated using an adaptive filter, which constructs a sequence of coefficients $[a_j(n)]$, which converge to the true coefficients as n goes to infinity. Thus $$a_j(n) = \quad (15)$$

$$a_j(n-1) - \mu \left[ \sum_{j=1}^{p} a_j(n-1) x(n-1-j) \right] x(n-j-1)$$

This then allows $\hat{x}(n)$ to be calculated as $$\hat{x}(n) = \sum_{j=1}^{p} a_j(n) x(n-j), \quad (16)$$

allowing the estimate $e(n)$ to be given by $$\hat{e}(n) = \hat{x}(n) - x(n) \quad (17)$$

Next, $b_i$ and $W(n)$ are estimated as those values $\hat{b}_i$ and $\hat{W}(n)$ which minimize the total squared error, namely $$G_n(\underline{b}, \underline{W}) = \Sigma [F_n(\underline{b}, \underline{W}) - e(n)]^2, \quad (18)$$

subject to the constraints $$R_p(n) = \sum_{i=0}^{m} W(n-i) W(m-p-i) = \begin{cases} C, & p = 0 \\ 0, & 1 \leq p \leq s \leq m, \end{cases} \quad (19)$$

where C is an arbitrary constraint, s is the number of unknown $\underline{W}$, and $$F_n(b,W) = \sum_{i=0}^{q} b_i W(n - i) \quad (20)$$

Supposing that at time $t_n = n\Delta t$ estimate $\hat{e}(n)$ is observed, then F can be computed from a backward sum as follows:

$$F_{n-k} = \sum_{i=0}^{q} b(i+1) W(n-k-i), \quad (21)$$

where $k = 0, \ldots, N$ where $n > N$, $b(i+1) = b_i$, and $W(n-k-i) = W_{n-k-i}$ where $n > k+i$ are Fortran arrays representing the unknowns. These unknowns can be represented at time n as $$\xi m = \begin{cases} W(n - m + 1), & m \leq s \\ b(m - s), & m > s \end{cases} \quad (22)$$

where $1 < m < s + q + 1$, and $q+1$ is the number of unknown b.

Thus, the problem can be written at time n as $$\delta \left\{ \sum_{k=0}^{N} (F_{n-k}(\xi) - e_{n-k})^2 + \sum_{p=0}^{s-1} \lambda_p (R_p - C\delta_{po}) \right\} = 0, \quad (23)$$

where $\lambda_p$ are Lagrange multipliers. The normal equations are $$2 \sum_{k=0}^{N} \left[ (F_{n-k} - e_{n-k}) \frac{\partial F_{n-k}}{\partial \xi m} + \sum_{p=0}^{s-1} \lambda_p \frac{\partial R_p}{\partial \xi m} \right] = 0 \quad (24)$$

and $$R_p(\xi) = C\delta_{po} \quad (25)$$

The normal equations musk be solved for $\xi$ (using the constraints to get $\lambda_p$), but they are nonlinear. Accordingly, the Gauss-Newton iteration method which ignores certain second derivatives is used to obtain:

$$\sum_{t} \left[ 2 \sum_{k=0}^{N} \frac{\partial F_{n-k}}{\partial \xi m} \frac{\partial F_{n-k}}{\partial \xi t} + \sum_{p=0}^{s-1} \lambda_p \frac{\partial^2 R_p}{\partial \xi m \partial \xi t} \right]_i (\xi^{i+1} - \xi^i) +$$

$$\sum_{p=0}^{s-1} \frac{\partial R_p}{\partial \xi m} (\lambda_p^{i+1} \lambda_p^i) =$$

$$- \left[ 2 \sum_{k=0}^{N} (F_{n-k} - e_{n-k}) \frac{\partial F_{n-k}}{\partial \xi m} + \sum_{p=0}^{s-1} \lambda_p \frac{\partial R_p}{\partial \xi m} \right]_i, \quad (26)$$

where i refers to the iteration number. The constraints are the linearized to $$\sum_{t} \frac{\partial R_p}{\partial \xi t} (\xi_t^{i-1} - \xi_t) = -R_p^i \quad (27)$$

These equations may be written in matrix form as $$\theta \Delta \xi + \Xi \Delta \lambda = I \quad (28)$$

$$H \Delta \xi = J,$$

where $$O_{mt} = 2 \sum_{k=0}^{N} \frac{\partial F_{n-k}}{\partial \xi m} \frac{\partial F_{n-k}}{\partial \xi t} + \sum_{p=0}^{s-1} \lambda_p \frac{\partial^2 R_p}{\partial \xi m \partial \xi t}$$

$$E_{mp} = \frac{\partial R_p}{\partial \xi m}$$

$$I_m = - \left[ 2 \sum_{k=0}^{N} (F_{n-k} - e_{n-k}) \frac{\partial F_{n-k}}{\partial \xi m} + \sum_{p=0}^{s-1} \lambda_p \frac{\partial R_p}{\partial \xi t} \right]$$

$$H_{pt} = \frac{\partial R_p}{\partial \xi t}$$

$$J_p = -R_p$$

A single matrix equation may be written as $$\begin{bmatrix} \theta & \Xi \\ H & O \end{bmatrix} \begin{bmatrix} \Delta \xi \\ \Delta \lambda \end{bmatrix} = \begin{bmatrix} I \\ J \end{bmatrix} \quad (29)$$

This is matrix equation is solved, and the results are used to update the iterates:

$$\xi^{n+1} = \xi^n + \Delta \xi, \text{ etc.} \quad (30)$$

The HIPS adaptive pattern recognition filter $F_B$ differs from the TRAPS adaptive pattern recognition filter $F_A$ in that the HIPS filter $F_B$ removes a second level of noise (if any) from the signal in learning the patterns $P_{NB}$ whereas the TRAPS filter $F_A$ includes this noise (if any) in learning the patterns $P_{NA}$. For example, if the first level of nose eliminated in the filter unit 1 is the DJIA, the second level of noise removed by the HIPS filter $F_B$ might be the trend of biotechnology stocks relative to the DJIA, so that the patterns $P_{NB}$ would focus on the individual stock, whereas the patterns $P_{NA}$ would include the trend of biotechnology stocks relative to the DJIA.

To reiterate, as illustrated in FIG. 4, each of the adaptive pattern recognition filters $F_A$, $F_B$, ..., $F_X$ learns a pattern $P_{NX}$ for each of the filtered signals $S_1$, $S_2$, $S_3$, ..., $S_N$. In the preferred embodiment discussed herein there would be six such patterns, namely, $P_{1A}$, $P_{2A}$, $P_{3A}$, $P_{1B}$, $P_{2B}$, $P_{3B}$. These patterns $P_{NX}$ are stored in a memory device (not shown) for further use as discussed below. These patterns $P_{NX}$ may optionally be output to an output device (not shown).

Figure 7:
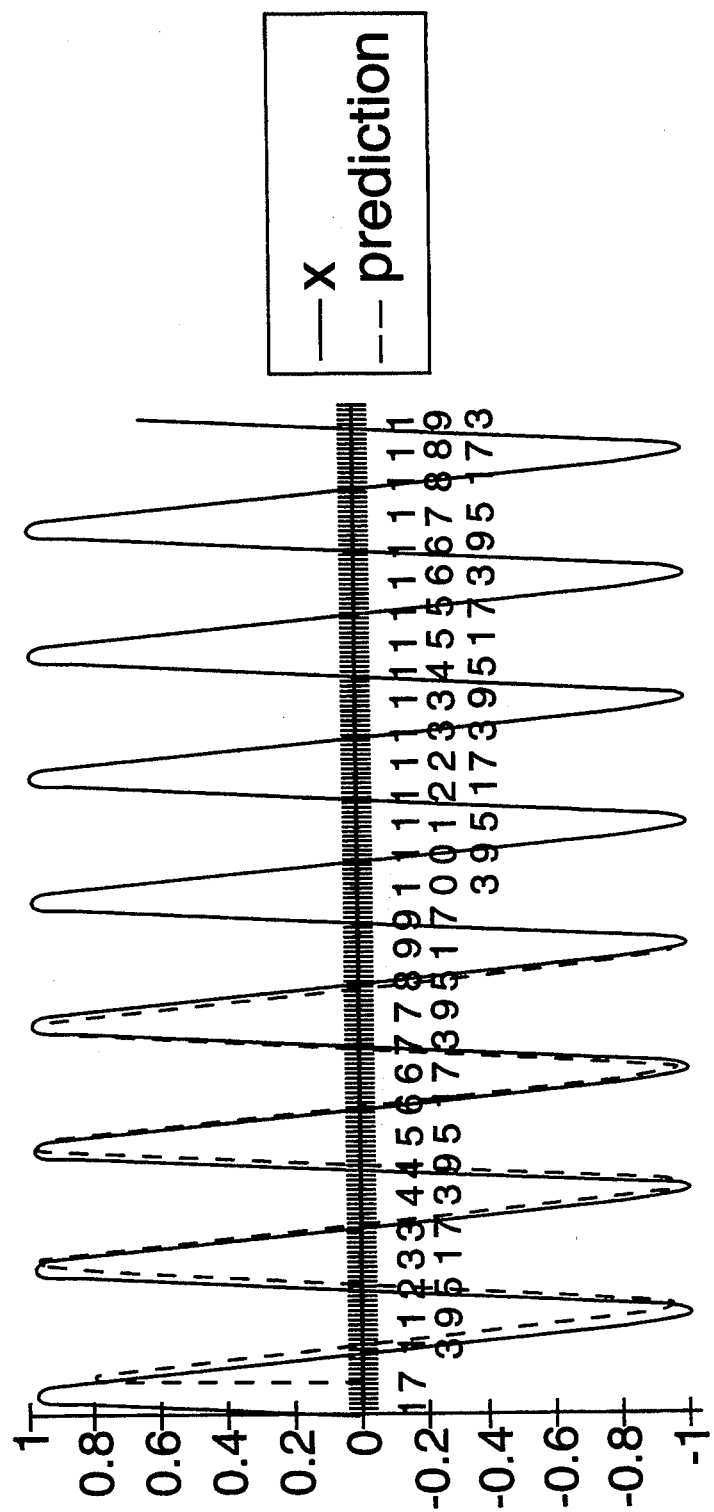
FIG. 7 is a comparison of a pattern learned by filter $F_A$ and actual noiseless signals.

FIG. 7 shows a sample output from a TRAPS filter $F_A$ for a noiseless sample showing actual stock price (solid line) and predicted stock price (dashed line) as a function of trading day (1–193). Note that the curve representing the actual stock price begins on the first trading day, whereas the curve of predicted prices generated by the adaptive pattern recognition filter $F_A$ is "turned on" on trading day 7. As seen in FIG. 7, the predicted curve quickly converges to the actual curve and coalesces therewith around trading day 91. How quickly the predicted value converges to the actual value depends on the value of $\mu$ of Equation (15).

Figure 8:
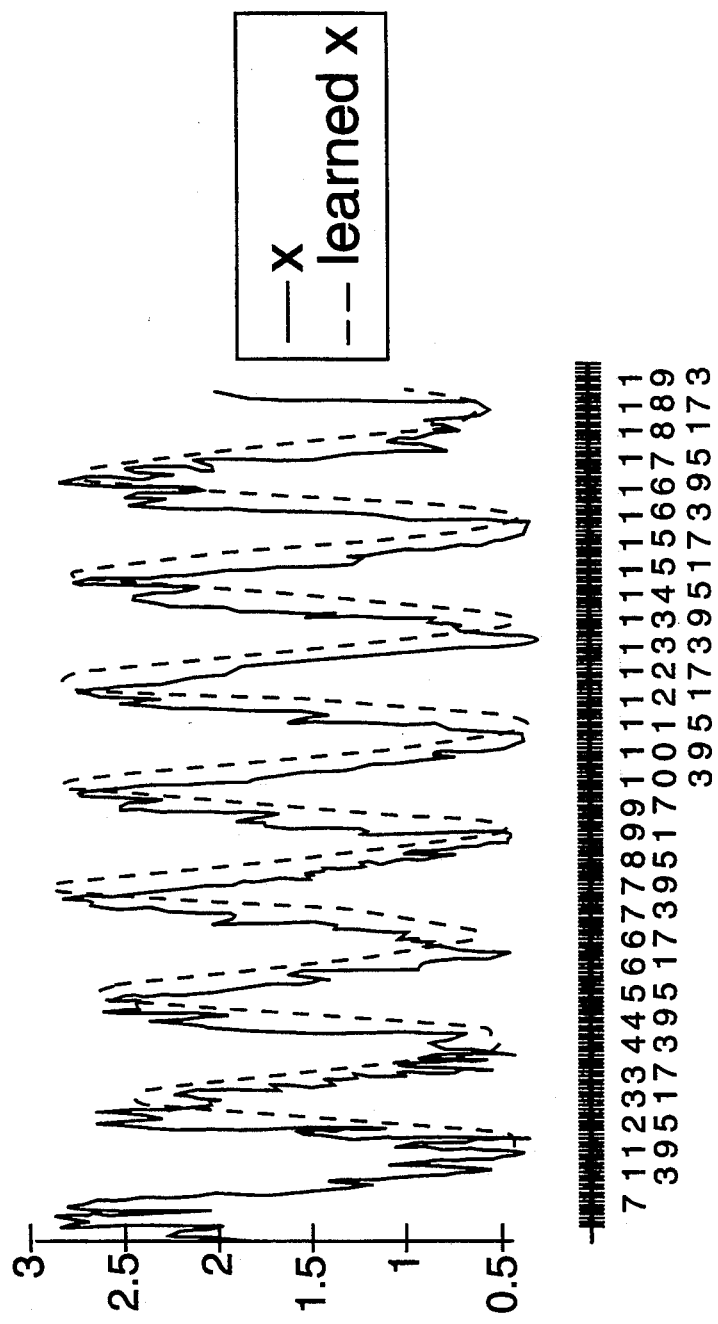
FIG. 8 is a comparison of a pattern learned by filter $F_A$ and actual noisy signals.

FIG. 8 shows a sample output from a TRAPS filter $F_A$ for a noisy sample, again showing actual stock price (solid line) and "learned" or predicted stock price (dashed line) as a function of trading day (1–193). Again, the curve representing the actual stock price begins on the first trading day, whereas the curve of learned prices generated by the adaptive pattern recognition filter $F_A$ is turned on trading day 7. As seen in FIG. 8, the learned curve converges to the actual noisy curve more slowly than in the case of the noiseless curve of FIG. 7.

Figure 9:
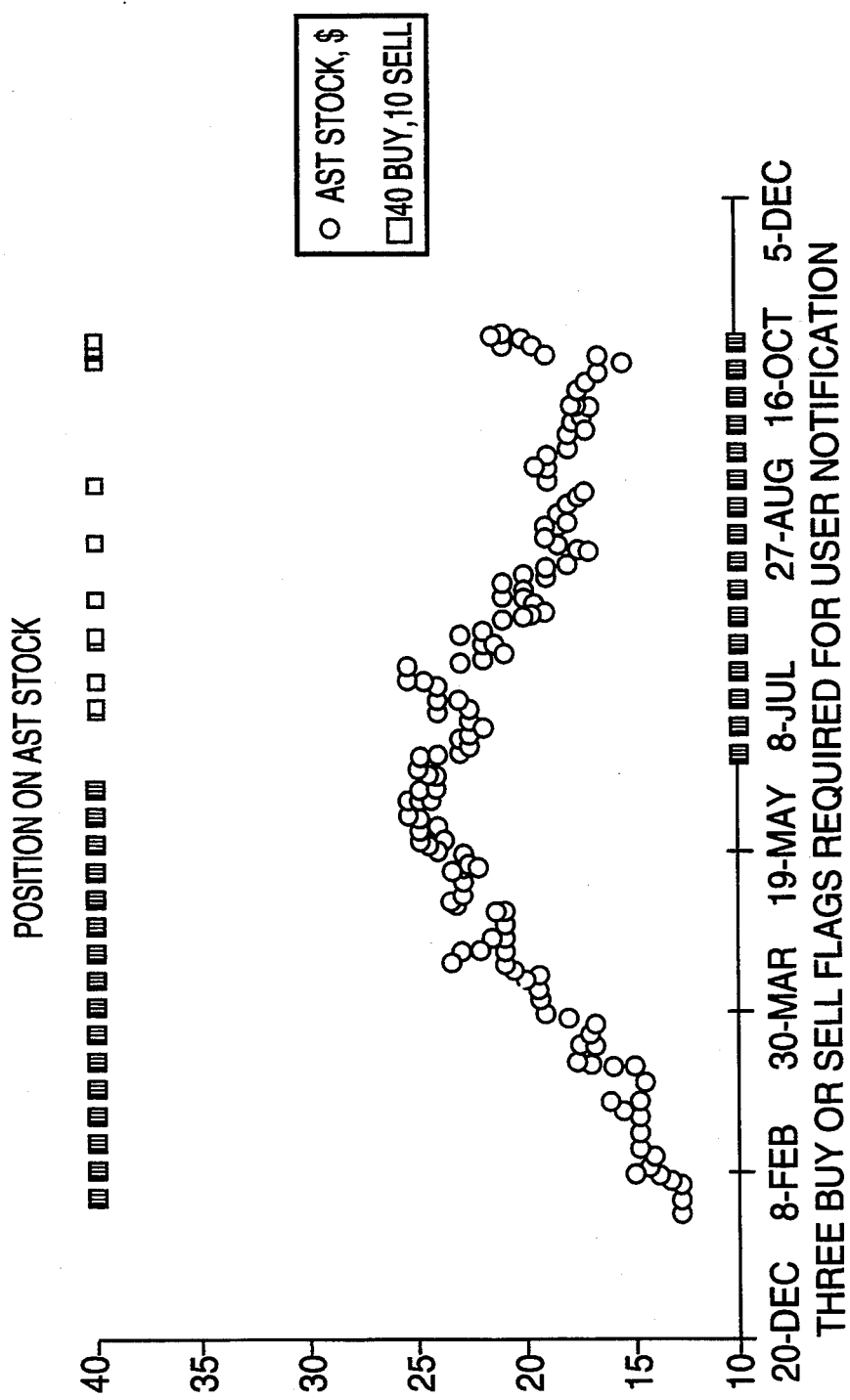
FIG. 9 is an example of a graphical output for an actual stock, as analyzed by the method and apparatus of the present invention, with icon flags denoting times to "buy" (uptrends) and time to "sell" (downtrends) stock, the emphasis being the invention's perspective of the position to take on a specific stock of interest.

FIG. 9 illustrates an optional "buy/sell" flag output from the adaptive pattern recognition unit 2 from an actual stock result. Using the learned pattern $P_{NX}$, unit 2 continues to track incoming filtered signals $S_N$ and to update the patterns $P_{NX}$. Based on the updated learned patterns $P_{NX}$ and the incoming signals $S_N$, unit 2 can determine when a stock price is in an uptrend and generate a "buy alert" flag with an actual buy signal given when three or more alerts occur (around February 8 to June), as well as when a stock price is in a downtrend and generate similar "sell alert" flags and "sell" flags (around June to mid-October).

Identifying an Event

Figure 10:
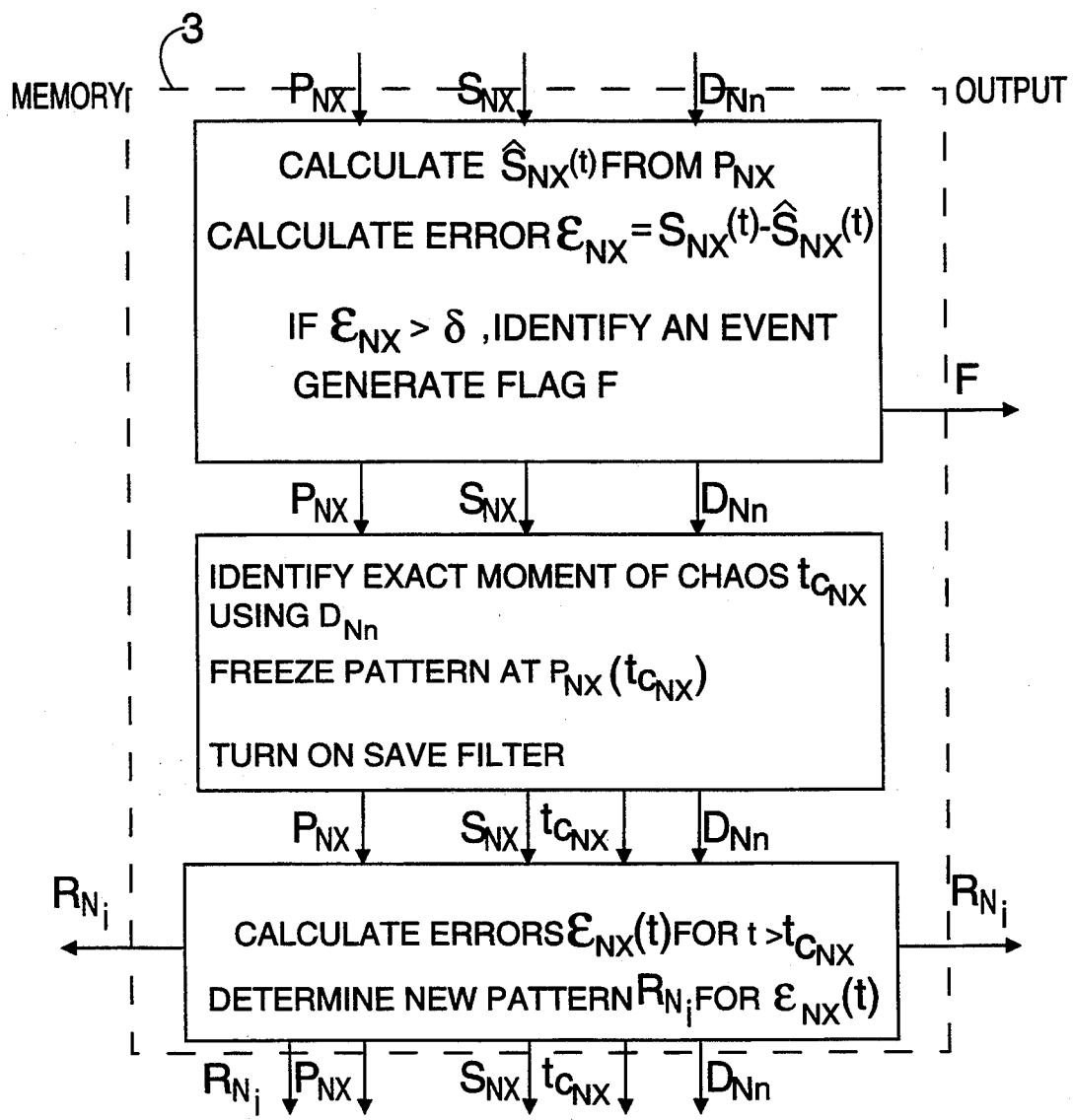
FIG. 10 is a schematic diagram illustrating the operations of the event identifying unit 3.

The neural network has learned and will continue to learn stock behavior, so that it can apply learned patterns $P_{NX}$ to incoming filtered signals $S_N$. Once the behavior of a stock has been learned in the system, the neural network can detect deviations of the incoming filtered signals $S_N$ from the learned patterns $P_{NX}$ and thus identify an "event" for the stock. An "event" is a deviation from the stocks recent past behavior, including both up and down trends from its original up and down trend. As shown in FIG. 10, the event identifying unit 3 includes the second and third stages of the chaos identifier neural network.

The at least one learned patterns $P_{1A}, \ldots, P_{NX}$ output by the pattern recognition unit 2 of the chaos identifier neural network, together with the filtered data signals $S_1, \ldots, S_N$ and the filtered discriminant signals $D_1, \ldots, D_N$, are input to the event identifying unit 3.

In the second stage of the chaos identifier, the event identifying unit 3 calculates the errors, $\epsilon_{1A}, \ldots, \epsilon_{NX}$, between the actual values of $S_1(n), \ldots, S_N(n)$ and the estimated values, $\hat{S}_1(\hat{n}), \ldots, \hat{S}_N(\hat{n})$, which are predicted from the patterns $P_{1A}(0,n-1), \ldots, P_{NX}(0,n-1)$. See Equations (9) and (10). If any of the errors exceeds a small specified amount $\delta$, say $\epsilon_{1A} > \delta$, then an event is flagged and a flag F may optionally be output to an output device. FIG. 9 is an example of an output of flags that is presented graphically. In the example of FIG. 9, the value of $\delta$ was set very small so that flags were generated almost daily to indicate a change in stock price and whether the change was positive or negative. Consequently, three flags were required to indicate a "change in buy/sell position" event.

In the third stage of the chaos identifier, the event identifying unit 3 ascertains the exact moment of chaos, $t_c$. See FIG. 11B which illustrates chaotic behavior relative to FIG. 11A. As illustrated in FIGS. 12A and 12B, after detecting a first significant (non-negligible) error $\epsilon$ between the actual signals $S_{NX}$ and the projected signals $\hat{S}_{NX}$ based on the learned patterns $P_{NX}$, the event identifying unit 3 continues to detect additional non-negligible errors $\epsilon$ defining an interval of event before being "certain" that an event has occurred. When the unit 3 is certain that an event has occurred, it determines the moment of chaos $t_c$ based on the first detected non-negligible error $\epsilon$.

Figure 12C:
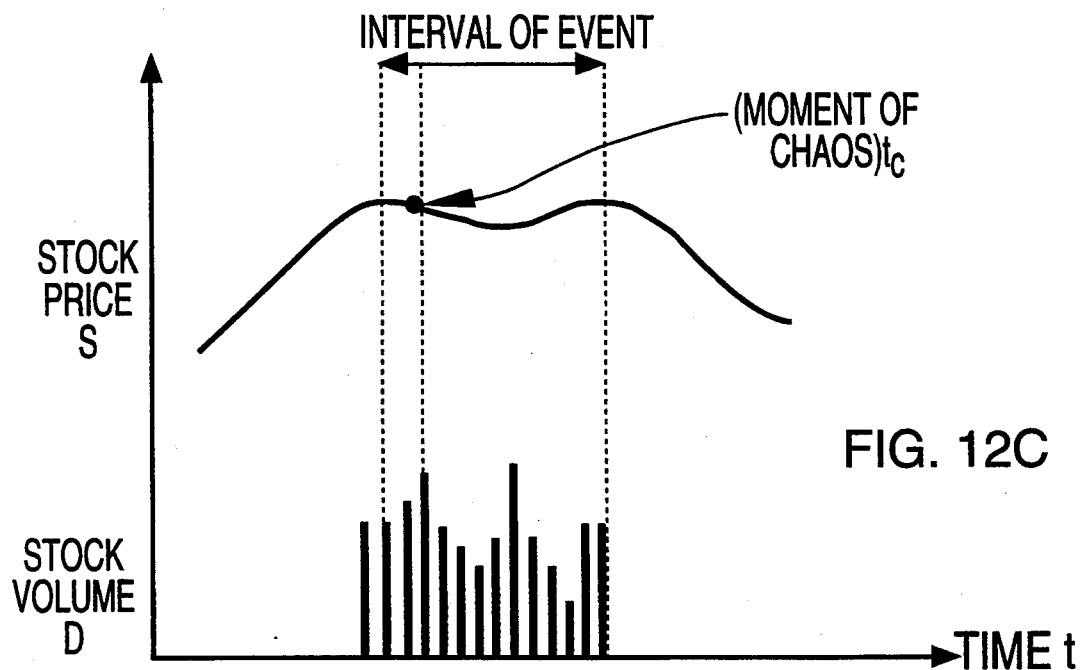

While the discriminant signals $D_N$ are not subjected to error evaluation in this preferred embodiment, they are used as an aid in choosing the exact moment of chaos. The incoming filtered volume signals $D_1$, $D_2$ are compared to the previous volume signals to ascertain whether and when a marked change in volume occurred. The time of the marked change in volume may then be used to determine the exact moment of chaos, namely time $t_c$, as shown in FIG. 12C.

The event identifying unit 3 freezes the patterns $P_{NX}$ at $P_{NX}(t_{cNX})$ and triggers the neural network to switch from the HIPS filter to a Self Adaptive and Variant Error ("SAVE") filter as discussed below.

Learning an Enhanced Pattern of Deviation

After an event has been determined, the data signals are passed through the SAVE filter to generate an enhanced signal, representative coefficients, and their respective polynomial expansion.

For the sake of illustration, consider a data signal array S which has been passed through a transparent filter $F_1$ to produce an unchanged data signal $S_1$. Thus $S_1$ will be a noisy signal, as illustrated in FIG. 14B, for example. Now, consider that the signal array $S_1$ from filter $F_1$ has been passed through both the TRAPS filter $F_A$ and the HIPS filter $F_B$ to generate patterns $P_{1A}$ and $P_{1B}$.

Next, consider that the event identifying unit 3 has determined that an event has occurred at time $t_{c1A}$ (based on the output of the TRAPS filter $F_A$) = time $t_{c1B}$ (based on the output of the HIPS filter $F_B$) = $t_c$ in FIG. 14B. And further consider that the time $t_c$ was identified as "certain" as of time $t_2$ based on the data received from time $t_0$ to time $t_2$. The output from the TRAPS filter based on the data signal array from time $t_0$ to time $t_2$ will be preserved for further analysis and the signal array $S_1$ from time $t_0$ to time $t_2$ will be reprocessed by the SAVE filter (rather than the HIPS filter), and the output of the SAVE filter will be used for further analysis.

Figure 13:
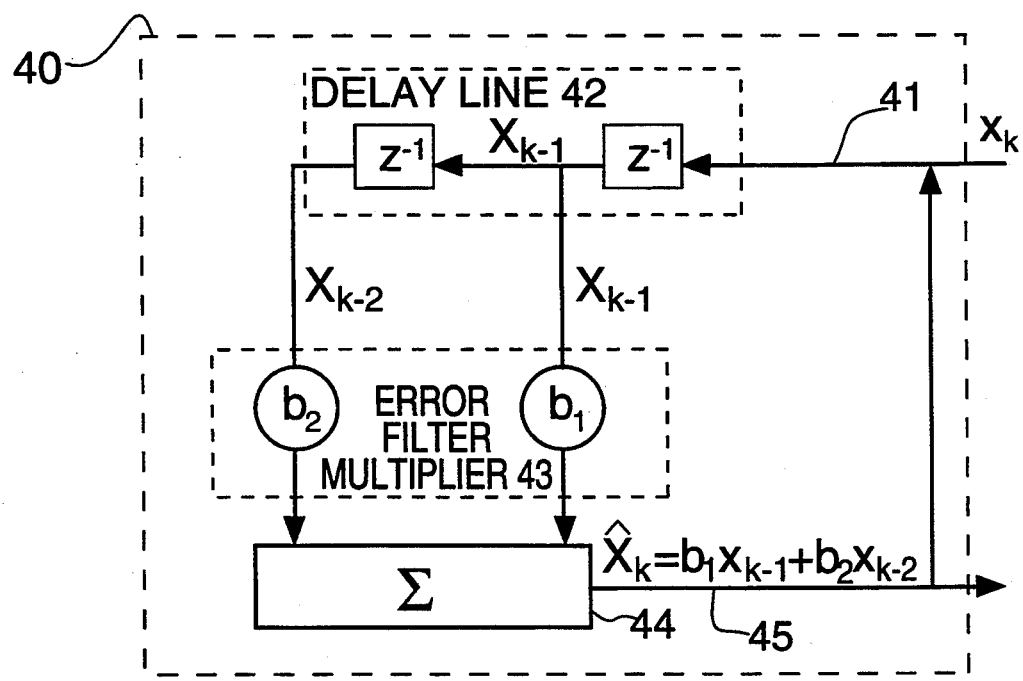

The SAVE filter operates on the principle that the present value of a polynomial may be computed recursively from previous values. Letting $Z^{-1}$ represent the delay operator, FIG. 13A shows an example where, with knowledge of two weighting coefficients or poles ($b_1$ and $b_2$ shown in FIG. 13A) and two noise-free samples ($x_{k-1}$ and $x_{k-2}$ also shown in FIG. 13A), it is possible to perfectly predict and specify the process for all time. The equation, as implied in FIG. 13A, can be generalized as:

$$x_n = b_1 x_{n-1} + b_2 x_{n-2} + \ldots + b_m x_{n-m} = \sum_{n=1}^{M} b_j x_{n-1} \quad (31)$$

Equation (31) is that of an autoregressive (AR) filter or "all pole" filter.

Consider that the signal is recorded several times. Each beginning of a recording is denoted $t_0$. For each recording the signal is within a time window, which begins at time $t_c$, and ends at time $t_2$. See FIGS. 14A and 14B. Initially all coefficients ($b_1, b_2, \ldots, b_m$) of Equation (31) are equal to zero outside of this time window. Also the signal, while maintaining an anticipated waveform, varies slightly per each recording, as well as varying slowly within the time window. See FIG. 14A. Thus the coefficients cannot be specified a priori. If the coefficients are all zero at $t_c$, then:

$$x_n = \sum_{j=1}^{m} b_j x_{n-j}. \quad (32)$$

Instead $$x_n = \sum_{j=1}^{m} b_j x_{n-j} + \epsilon_n. \tag{33}$$

This is the error filter approach. The coefficients may be adjusted as:

$$b_j(n-1) = b_j(n) + \mu x(n-j)\epsilon_n \tag{34}$$

where $\mu$ is an adaptation time constant. After a certain number of time slices, the coefficient values approach their actual value for a specific scenario, and the error approaches zero. This adaptive AR method is mathematically appealing, since resolving the coefficients occurs by means of solving a simple quadratic equation.

Now, consider a series of recordings in which the signal is as described above in Equations (32) through (34), except that now for these recordings some type of noise is added. This noise could be just background noise, a depicted in FIG. 14B, or the noise could be an interfering signal plus background noise. Following the linear difference procedure which resulted in Equation (31), the realized mathematical filter for developing FIG. 14B is:

$$x_n = b_1 x_{n-1} + \ldots + b_m x_{n-m} + a_0 w_n + a_1 w_{n-1} + \tag{35}$$

$$a_L w_{n-L} = \sum_{j=1}^{M} b_j x_{n-j} + \sum_{k=0}^{L} a_k w_{n-k}$$

where $a_k$ are the coefficients of the background noise and/or an interfering signal, $w_{n-k}$ are the force functions of the moving average (MA) portion $= x_{n-k}$ when $t_2 < t < t_c$. Equation (35) represents the autoregressive moving average (ARMA) model. This SAVE filter can be transitioned into an error filter, but the equation is not a simple quadratic, as in the case of the adaptive AR filters discussed above.

Figure 13B:
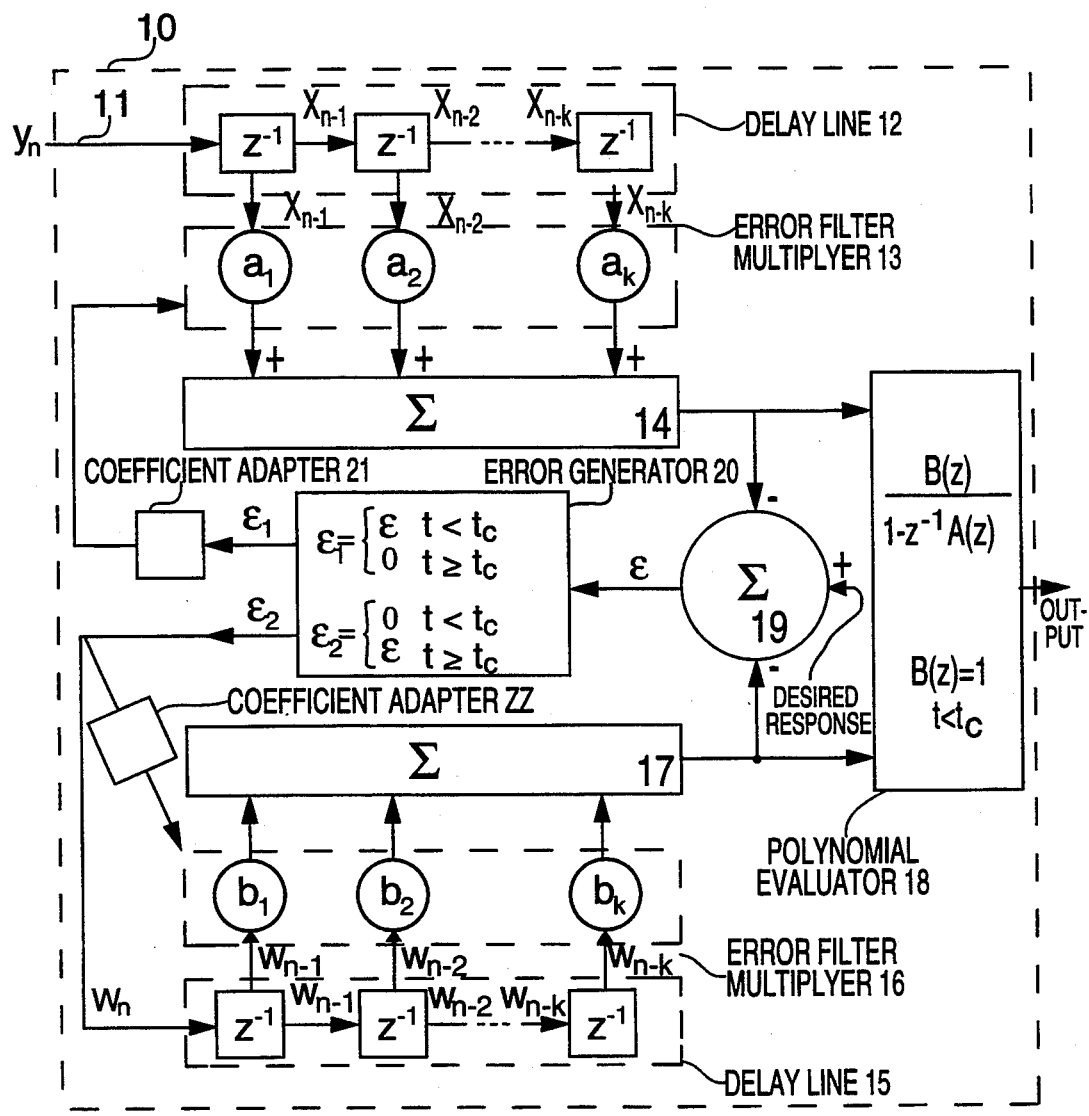
FIGS. 13B and 13C are circuit diagrams illustrating the self-adaptive and variant error ("SAVE") filter 10 for learning a new pattern of deviations of signals from a previously learned pattern.

Referring further now to FIG. 13B, there is shown a circuit diagram illustrating the self adaptive and variant error (SAVE) filter for learning a new pattern of deviations of signals from a previously learned pattern.

The self adaptive and variant error (SAVE) filter 10 has an input 11 for receiving a series of input signals $x_n$ for being processed.

A delay line 12 receives the input signals $x_n$ and consists of at least two delay stages $Z^{-1}$, each representing a fixed delay related to a sampling interval of the signals $x_n$. Each delay stage $Z^{-1}$ has an output for outputting the delayed signals $x_{n-1}$, $x_{n-2}$, ..., respectively.

An error filter multiplier 13 includes at least two multipliers, each such multiplier being connected to a respective one of the outputs from the at least two delay stages $Z^{-1}$, as shown in FIG. 13B. Each of the multipliers in the error filter multiplier 13 generates a respective coefficient value $a_1, a_2, \ldots$ and calculates the respective product $a_1 x_{n-1}, a_2 x_{n-2}, \ldots$.

The products $a_1 x_{n-1}, a_2 x_{n-2}, \ldots$ are output from the respective multipliers to a summer 14, which computes the sum $a_1 x_{n-1} + a_2 x_{n-2} + \ldots$. The summer 14 has an output 15 that feeds the polynomial evaluator 18 and the adaptive summer 19. Before the moment of chaos $t_c$, the polynomial evaluator 18 outputs the polynomial resulting from summer 14 only.

Prior to time $t_c$, the adaptive summer 19 produces an error solely from the difference between the desired response and the output from summer 14. That is, if there are m delays, then the error $\epsilon$ is $$\epsilon = x_n - \sum_{j=1}^{m} a_j x_{n-j} \tag{36}$$

This in turn feeds to the error generator 20.

The error generator 20 outputs the error to the coefficient adaptor 21 until time $t_c$. The coefficient adaptor 21 updates the coefficients, namely $$a_{j+1} = a_j + \epsilon \mu x_{n-j} \tag{37}$$

In summary, until the moment of chaos $t_c$, the unit behaves as the TRAPS filter described earlier.

At the moment of chaos detection, (1) the values of delay line 12 and error filter multiplier 13 are "saved" for their values as mapped into the time domain, (2) the error generator 20 feeds the error $\epsilon$ into the coefficient adaptor 22, and (3) the polynomial evaluator allows B(z) to be other than 1.

Figure 13C:
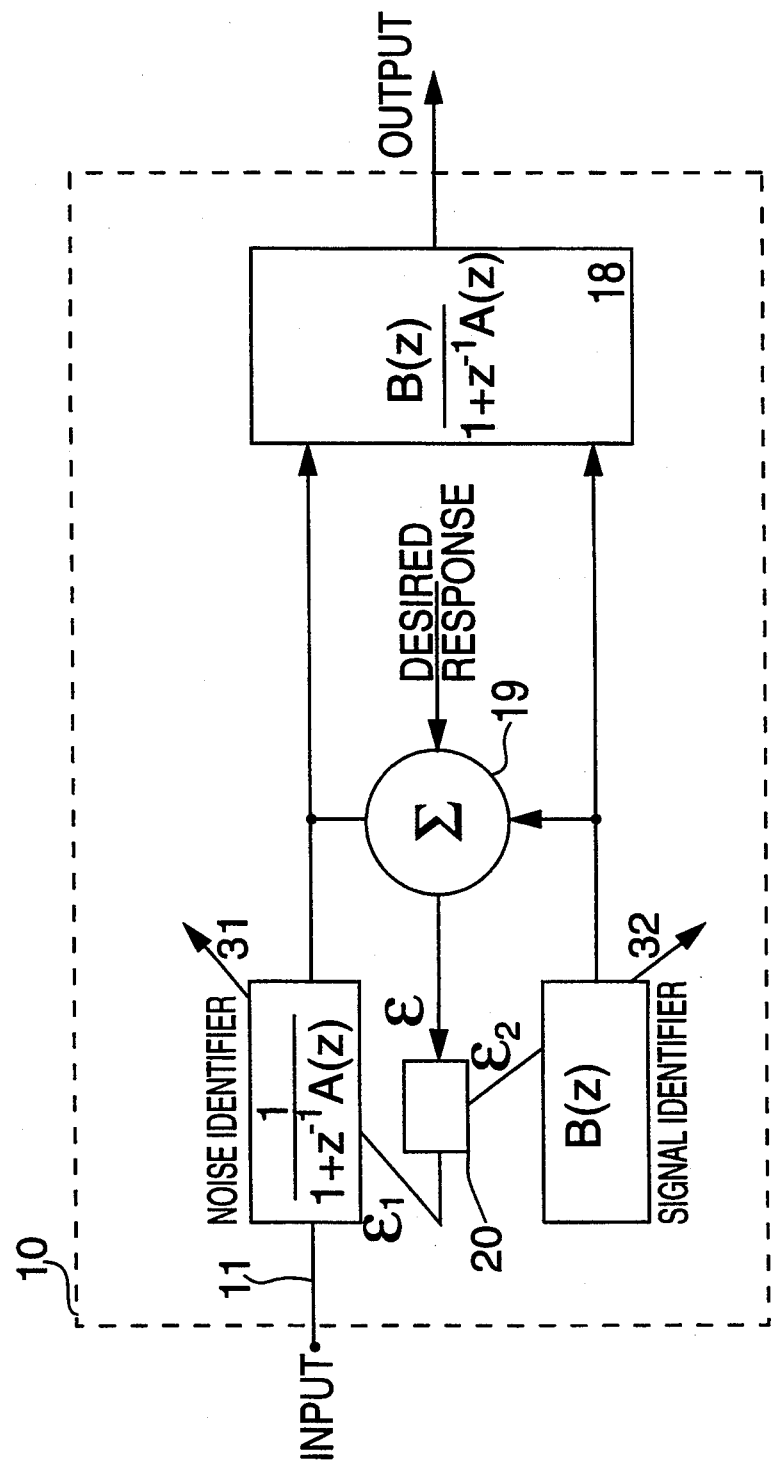

FIG. 13C presents the SAVE filter in standard adaptive filter nomenclature. The noise identifier 21 comprises delay line 12, error filter multiplier 13, and summer 14. The signal identifier 32 comprises delay line 15, error filter multiplier 16, and summer 17. The polynomial evaluator 18, the adaptive summer 19, and the error generator 20 are the same as in FIG. 13B.

Ultimately, the SAVE filter generates a new polynomial expansion pattern $R_{Ni}$, which is then provided to the "fractal monitor" neural network for further analysis as described below.

The "Fractal Monitor" Neural Network

The "fractal monitor" neural network unit 4 will now be explained with reference to FIG. 15. The filtered data signals $S_{1A}, \ldots, S_{NX}$, each with its respective identified moment of chaos, $t_{c1A}, \ldots, t_{cNX}$, the pre-moment of chaos patterns $P_{NX}$, the representative patterns $R_{Ni}$ of the enhanced post-moment of chaos data signals, and the discriminant signals $D_{1n}, \ldots, D_{Nn}$ are sent to a pattern recognition system unit 4. For simplicity, $R_{Ni}$ is used to refer to the output of the SAVE filter and/or the TRAPS filter. The pattern recognition system learns adaptively from experience and separates various discriminants from the unrelated or attenuating factors.

The unit 4 consists of at least one, preferably more than one, and most preferably three, pattern recognition weighting units $W_1, W_2, W_3, \ldots W_M$, at least one of which generalizes the signal pattern $R_{Ni}$, for $i > 0$, in a pattern vault and chooses the stored pattern $R_{NX}$ which most easily generalizes to the signal pattern $R_{Ni}$ and assigns weights $W_{NX}$ to the precision of the fit of $R_{Ni}$ to $R_{NX}$.

The fractal monitor neural network unit 4 also utilizes stored information. Specifically, signal patterns R representing actual events in the stock market based on actual experiences are stored in a data vault (not shown) for accession by the fractal monitor neural network unit 4. These patterns R are stored in the data vault prior to operation of the system. They may be stored in a read-only memory (ROM). Alternately, if it is desired to update the collection of patterns R stored in the data vault based on the $R_{Ni}$ generated by actual experience with the system, some other form of memory device, such as a random-access memory (RAM), may be used.

Each of the at least one weighting units $W_1, \ldots, W_M$ receives the new pattern $R_{Ni}$ of deviations calculated by the SAVE filter 10 and accesses the collection of patterns R stored in the data vault. Each weighting unit $W_1, \ldots, W_M$ tries to match the pattern $R_{Ni}$ to one or more of the stored patterns R to determine what "event" is happening to the particular stock. Each weighting unit $W_1, \ldots, W_M$ assigns a weight $W_{NXM}$ to the fit of the $R_{Ni}$ to each stored pattern R and then selects the pattern $R_{NX}$ which best matches the pattern $R_{Ni}$. Each weighting unit $W_1, \ldots, W_M$ uses a different technique to choose a best fit stored pattern $R_{NX}$.

Figure 15:
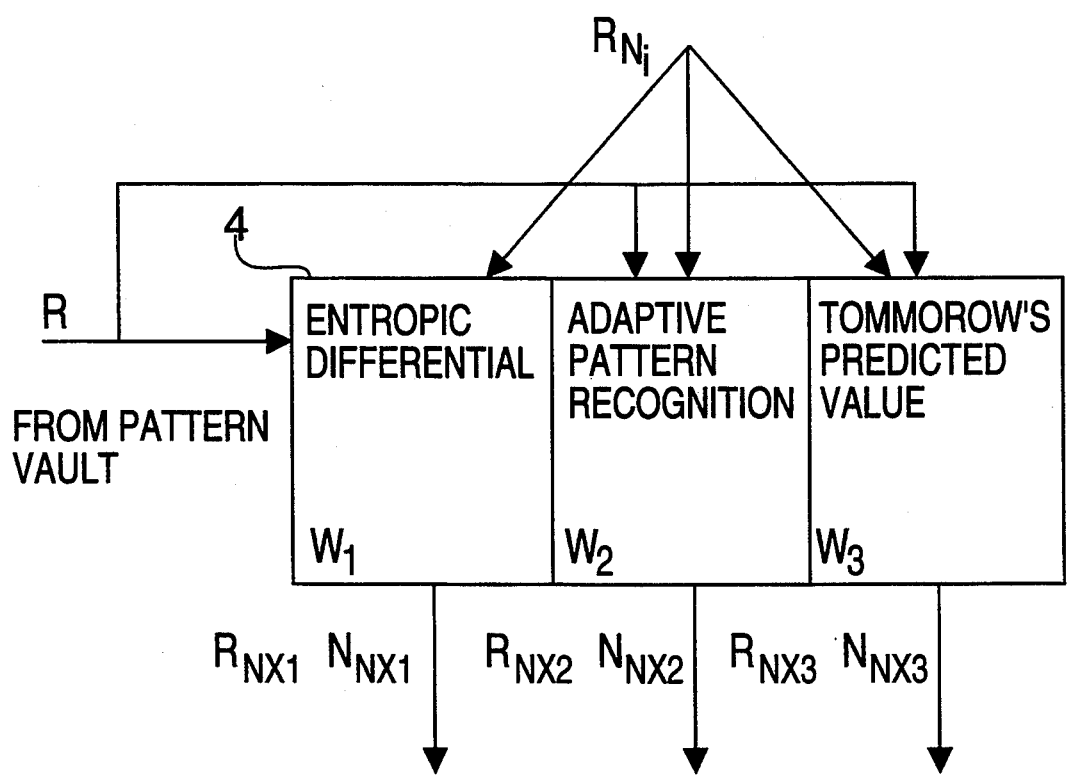
FIG. 15 is a schematic diagram of the weighting unit 4 for weighting the fit of the calculated patterns to patterns stored in a data vault.

In the exemplary embodiment of FIG. 15, weighting unit $W_1$ is an entropic differential weighting unit which looks for the R which has the least number of spontaneous changes or differences from $R_{Ni}$. Weighting unit $W_1$ computes $$W_{NX}(R) = \int_{t=1}^{T} [R_{Ni}(t) - R(t)] \tag{38}$$

Weighting unit $W_1$ will then choose $R_{NX}$ to minimize $W_{NX}(R)$ and output the selected pattern $R_{NX1}$ together with the weight $W_{NX1}$. The weighting by unit $W_1$ may be done with and/or without self-similarity matching.

Self-similarity matching is discussed at length in A. Lindenmayer & P. Rusinkiewicz, *The Algorithmic Beauty of Plants* (Springer-Verlag, New York: 1990), in particular in Chapter 8, which is hereby incorporated by reference in its entirety.

Figure 14A:
FIGS. 14A and 14B are depictions of hypothetical signals without and with noise, respectively.
Figure 14B:

In line with the techniques presented in the cited reference, the entire signal, as seen in FIG. 14A or 14B, from point $t_0$ to $t_1$ is scanned for a similarity match to a subset signal. If a similarity is found or matched, the event to which the similarity is found must match the decision made for the decision to be accepted.

Weighting unit $W_2$ in the exemplary embodiment of FIG. 15 is an adaptive pattern recognition weighting unit which determines how easily it is to generalize $R_{Ni}$ to R. Weighting unit $W_2$ operates by performing a regression on $R_{Ni}$ to try to generate each $R_{NX}$ stored in the data vault. Unit $W_2$ assigns a weight $W_{NX}(R)$ to each R based on the number of iterations necessary to regress $R_{Ni}$ to R. Because of the presence of Rs which do not correlate with $R_{Ni}$, it is desirable to set a maximum number of iterations (and hence a maximum weight), for example, at 100 or 200. After attempting to generalize $R_{Ni}$ to each R in the vault, unit $W_2$ will select the $R_{NX}$ which minimizes $W_{NX}(R)$, i.e., requires the fewest iterations, and output the selected pattern $R_{NX2}$ together with the weight $W_{NX2}$. Weighting unit $W_2$ may use an adaptive pattern recognition filter such as the TRAPS filter discussed above, or some other form of neural network. Again, as in the case of unit $W_1$, unit $W_2$ may perform weighting with and/or without self-similarity matching, as described above.

In the exemplary embodiment of FIG. 15, weighting unit $W_3$ assigns weights based on the error between the actual signal and the predicted value of the signal. Thus, weighting unit $W_3$ computes the next predicted value $\hat{S}_{NX}(R)$ for each stored pattern R and compares it to the actual value $s_{NX}$ to compute the error $\epsilon(R) = s_{NX} - \hat{S}_{NX}(R)$. Unit $W_3$ assigns a weight $W_{NX}(R)$ to each R based on the error $\epsilon(R)$. Unit $W_3$ will select the $R_{NX}$ which minimizes $W_{NX}(R)$, i.e. has the smallest error $\epsilon(R)$, and output the selected pattern $R_{NX3}$ together with the weight $W_{NX3}$.

It should also be noted that this system presently describes a matching based on point-to-point perspective. In some uses of the invention, the matching of these patterns is improved with a compression of either the generated pattern or the vault pattern. This compression can be done without loss of meaning for example, as described in B Schnitta-Israel and R. S. Freedman, "Increasing the Usefulness of AWACS Downlink Transmissions by Semantic Compression," AGARD Conference Proceedings No. 414 (1986), which is hereby incorporated by reference in its entirety.

The Expert System

The resultant chosen patterns $R_{NXM}$ and their associated weights $W_{NXM}$ are input to an expert system ranking unit 5. The expert system ranking unit 5 prioritizes the patterns $R_{NXM}$ by weight $W_{NXM}$ and hence facilitates identification of the buy/sell actions that give the user the most potential for profitable actions. The selected actions can be relatively prioritized and output to an output device (not shown).

If desired, the expert system ranking unit 5 can be provided with a preprogrammed set of "rules" based on actual experiences with stocks. The expert system, using a set of rules, determines, given the $R_{NXM}$ and $W_{NXM}$, which signals qualify for any specified category $C_f$ and assigns a composite weight $W_f$ to the category $C_f$. In the preferred embodiment, these could be stocks for buy or sell. These outputs optionally may be processed through a further ranking unit which rearranges the categories $C_f$ according to $R_{NXM}$, $W_{NXM}$, and $W_f$, using, but not limited to, such a strategy as case-based reasoning, which generalizes rules. For example, if experience shows that "quick ups" are more volatile, shorter-lived, and harder to predict than "quick downs", the "rules" may dictate that actions based on "quick downs" outrank (take priority over) actions based on "quick ups." The results are output to an output device (not shown).

TABLE 1

| COMPANY | SYMBOL | TIME | PATTERN | WEIGHT |
|---|---|---|---|---|
| PFIZER INC | PFE | 13 | general up | 55.11 |
| | | 13 | up | 80.64 |
| | | 3 | strong up | 46.26 |
| | | 3 | down | 55.88 |
| MEDICAL 21 CORP | MEDC | 13 | general up | 56.24 |
| | | 13 | up | 104.80 |
| | | 3 | general up | 49.62 |
| | | 3 | up | 87.39 |
| SYNCOR INTL CORP | SCOR | 13 | general up | 64.03 |
| | | 13 | up | 64.03 |
| | | 3 | general up | 43.76 |
| | | 3 | up | 43.76 |

Three examples, based on actual output, are shown in Table 1. The time of 13 represents the time of the event (moment of chaos $t_c$) based on data signals passed through the nonadaptive noise filter $F_2$ to remove market noise, but not industry noise. The time of 3 represents the time of certainty of the event (see FIGS. 12A and 12B) based on data signals passed through the adaptive noise filter $F_3$ to remove industry noise. The patterns represent the patterns $R_{NX}$ chosen from the vault patterns R by the weighting unit, and the weights represent the weights $W_{NX}$ determined by the weighting unit. In these examples, the four best fits were chosen without regard to which technique was used by the weighting unit.

These examples have not been processed by the expert system. As an example of how they might be so processed, the expert system could be programmed with a series of rules. For example, one rule might be to reject any stock where the four best fits are not all "up" or all "down." Using this rule, PFIZER would be rejected by the expert system. Another rule might be to reject any stock where the weights of the four best fits are not all within specified limits. For example, for the first two entries using data from the nonadaptive noise filter, the limits might be a maximum of 70 for the best fit and 100 for the second best fit. For the last two entries using data from the adaptive noise filter, the limits might be a maximum of 50 for the best fit and 75 for the second best fit. Using this rule, MEDICAL would be rejected by the expert system. Thus, the expert system could be programmed simply to apply the desired rules and output only those stocks which meet all the rules, in this example, only SYNCOR.

Preferably, the expert system utilizes a sophisticated rule-based system, such as case-based reasoning, that can generalize rules. For example, after identifying SYNCOR as a stock of interest, the expert system would be able to use fuzzy logic to consider how good the fit was to a specific pattern and what that pattern meant for that particular stock. In other words, it would learn that whenever SYNCOR matched a certain pattern in the vault, the stock price would rise significantly within a day and then subside. Thus, any "buy" recommendation would be output as a "buy immediately" recommendation (rather than a "buy for long-term hold").

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to falling within the scope of the invention.

I claim:

1. An apparatus for retrieving signals embedded in noise and analyzing the signals, comprising
    an input device for receiving a plurality of input signals comprising noise;
    noise filtering means, including at least one noise filter, for retrieving data signals embedded in the plurality of input signals received from said input device;
    first pattern recognition means, including at least one adaptive pattern recognition filter, for generating first coefficients of a polynomial expansion representing the data signals received from said noise filtering means;
    first storage means for storing the first coefficients generated by said first pattern recognition means;
    event identifying means for calculating a predicted value of a next data signal based on the first coefficients stored in said first storage means, for comparing a next data signal to the predicted value to determine when an event has occurred, said event located at any position within the data signals, and for ascertaining an exact moment of the event;
    second pattern recognition means, including an adaptive autoregressive moving average pattern recognition filter, for generating second coefficients of a polynomial expansion representing the data signals received from said noise filtering means;
    second storage means for storing a plurality of predefined stored patterns each representing a known event type and having a known event location;
    weighting means, including at least one weighting filter, for retrieving the plurality of predefined stored patterns from said second storage means, aligning the known event location of each of the predefined stored patterns with the exact moment of the even of the data signals and comparing the plurality of predefined stored patterns with the second coefficients generated by the second pattern recognition means, and for generating weights for each of the plurality of stored patterns based on said comparison; and
    an output device for outputting output signals representing the weights generated by said weighting means.

2. The apparatus of claim 1 further comprising
    ranking means for rearranging the output signals according to weight and for testing the output signals against existing rules; and
    means for outputting the ranked output signals to the output device.

3. The apparatus of claim 1 wherein a first one of said at least one noise filter comprises an adaptive noise filter.

4. The apparatus of claim 3 further including second noise filter means for retrieving data signals embedded in the input signals received from said input device, wherein said second noise filter means comprises a nonadaptive noise filter.

5. The apparatus of claim 4 further including third noise filter means for retrieving data signals embedded in the input signals received from said input device, wherein said third noise filter means includes a transparent filter.

6. The apparatus of claim 1 wherein one of said at least one adaptive autoregressive pattern recognition filters comprises a hybrid image processing system (HIPS) filter.

7. The apparatus of claim 1 wherein one of said at least one adaptive autoregressive pattern recognition filters comprises a transient acoustic processing system (TRAPS) filter.

8. The apparatus of claim 1 wherein said at least one adaptive autoregressive pattern recognition filters includes a HIPS filter and a TRAPS filter.

9. The apparatus of claim 1 wherein said second pattern recognition means includes a self adaptive and variant error (SAVE) filter.

10. A method for retrieving signals embedded in noise and analyzing the signals comprising the steps of:
    inputting a plurality of signals comprising noise;
    filtering said plurality of input signals to retrieve a plurality of filtered data signals from the input signals;
    passing said plurality of filtered data signals through at least one adaptive pattern recognition filter to generate a first set of coefficients of a polynomial expansion representing the plurality of filtered data signals;
    storing the first set of coefficients;
    calculating a predicted value of a next signal based on the first set of coefficients;
    comparing a next data signal to the predicted value to determine when an event has occurred;
    ascertaining an exact moment of the event for the plurality of filtered data signals;

passing said plurality of filtered data signals through at least one adaptive autoregressive moving average pattern recognition filter to generate a second set of coefficients of a polynomial expansion representing said plurality of filtered data signals;

retrieving a plurality of stored patterns from a storage device, each one of the plurality of stored patterns representing a known event type and having a known event location;

aligning the known event location of each of the plurality of stored patterns with the exact moment of the event of the plurality of filtered data signals;

comparing each one of the plurality of stored patterns with the second set of coefficients to generate weights for each of the plurality of stored patterns; and outputting signals representing the generated weights.

11. The method of claim 10 further comprising the step of:

rearranging the output signals according to weight, testing the output signals against existing rules, and outputting the output signals in a ranked order.

12. The method of claim 10 wherein said step of passing said plurality of input signals through at least one noise filter includes passing said signals through an adaptive noise filter.

13. The method of claim 12 wherein said step of passing said plurality of input signals through at least one noise filter further includes passing said signals through a nonadaptive noise filter.

14. The method of claim 13 wherein said step of passing said plurality of input signals through at least one noise filter further includes passing said signals through a transparent noise filter.

15. The method of claim 10 wherein said step of passing said plurality of filtered data signals through at least one adaptive autoregressive pattern recognition filter includes passing said signals through a hybrid image processing system (HPS) filter.

16. The method of claim 10 wherein said step of passing said plurality of filtered data signals through at least one adaptive autoregressive pattern recognition filter includes passing said signals through a transient acoustic processing system (TRAPS) filter.

17. The method of claim 10 wherein said step of passing said plurality of filtered data signals through at least one adaptive autoregressive pattern recognition filter includes passing said signals through a HIPS filter and a TRAPS filter.

18. The method of any of claims 10, 15, 16, or 17 further comprising the step of:

outputting signals representing the generated coefficients of the polynomial expansion representing the pattern of data signals.

19. The method of claim 10 further comprising the step of:

outputting a signal flag when an event is determined to have occurred.

20. The method of claim 10 wherein said step of passing said plurality of filtered data signals through at least one adaptive autoregressive moving average pattern recognition filter further comprises the step of passing said signals through a self adaptive and variant error (SAVE) filter.

21. The method of claim 10 further comprising the steps of:

inputting to the input device a second plurality of signals containing information related to the first plurality of input signals; and passing said second plurality of signals through at least one noise filter to retrieve discriminant signals embedded therein;

and wherein said step of ascertaining the exact moment of the event $t_c$ further comprises the step of comparing each discriminant signal to the previous discriminant signals to determine the presence of a marked change in the value of said discriminant signals.

22. The method of any of claims 11, 16, 17, 17, 20, or 21 wherein the plurality of signals comprising noise represent prices of stock as a function of time.

23. An apparatus for retrieving signals embedded in noise and analyzing the signals, comprising an input device for receiving a plurality of input signals comprising noise;

noise filtering means for retrieving a plurality of data signals embedded in the plurality of input signals received from said input device;

pattern recognition means for generating coefficients of a polynomial expansion representing the plurality of data signals received from said noise filtering means;

first storage means for storing the coefficients generated by the pattern recognition means;

event identifying means if or calculating a predicted value of a next data signal based on the coefficients stored in said first storage means, for comparing a next data signal to the predicted value to determine when an event has occurred, said event located at any position within the data signals, and for ascertaining an exact moment of the event;

second storage means for storing a plurality of predefined stored patterns each representing a known event type and having a known event location;

weighting means for retrieving the plurality of predefined stored patterns from said second storage means, aligning the known event location of each of the predefined stored patterns with the exact moment of the event of the plurality of data signals and comparing the plurality of predefined stored patterns with the coefficients generated by the pattern recognition means, and for generating weights for each of the plurality of stored patterns based on said comparison; and an output device for outputting signals representing the weights generated by said weighting means.

24. The apparatus of claim 23 wherein the pattern recognition means includes at least one transparent filter.

25. The apparatus of claim 23 wherein the pattern recognition means includes at least one adaptive pattern recognition filter.

26. The apparatus of claim 23 wherein the pattern recognition means includes at least one adaptive autoregressive moving average pattern recognition filter.

27. An apparatus for retrieving signals embedded in noise and analyzing the signals, comprising an input device for receiving a plurality of input signals comprising noise;

a noise filter for retrieving a plurality of data signals embedded in the plurality of input signals received from the input device;

at least one pattern recognition filter for generating coefficients of a polynomial expansion representing the plurality of data signals received from the noise filter;

a storage device for storing the coefficients generated by the pattern recognition filter and for storing a plurality of predefined stored patterns each representing a known event type and having a known event location;

means for calculating a predicted value of a data signal based on the coefficients;

means for comparing at last one of the plurality of data signals to the predicted value to determine when an event has occurred, said event located at any position within the data signals;

means for ascertaining an exact moment of the event;

means for retrieving the plurality of predefined stored patterns from the storage device;

means for aligning the known event location of each of the predefined stored patterns with the exact moment of the event of the plurality of data signals;

means for comparing the plurality of predefined stored patterns with the coefficients and generating weights for each of the plurality of stored patterns; and an output device for outputting signals representing the weights generated.

28. The apparatus of claim 27 wherein the at least one pattern recognition filter comprises at least one transparent filter.

29. The apparatus of claim 27 wherein the at least one pattern recognition filter comprises at least one adaptive pattern recognition filter.

30. The apparatus of claim 27 wherein the at least one pattern recognition filter comprises at least one adaptive autoregressive moving average pattern recognition filter.

31. An method for retrieving signals embedded in noise and analyzing the signals, comprising the steps of:
receiving a plurality of input signals comprising noise;

filtering the plurality of input signals to obtain a plurality of data signals;

filtering the plurality of data signals to generate coefficients of a polynomial expansion representing the plurality of data signals;

calculating a predicted value of a data signal based on the coefficients;

comparing at least one of the plurality a data signals to the predicted value to determine when an event has occurred, said event located at any position within the data signals;

ascertaining an exact moment of the event;

providing a plurality of predefined stored patterns each representing a known event type and having a known event location;

aligning the known event location of each of the predefined stored patterns with the exact moment of the event of the plurality of data signals;

comparing the plurality of predefined stored patterns with the coefficients and generating weights for each of the plurality of stored patterns; and outputting signals representing the weights generated.

32. The method of claim 31 wherein the step of filtering the plurality of data signals further comprises the step of filtering the plurality of data signals using at least one adaptive autoregressive moving average pattern recognition filter.

33. The method of claim 31 wherein the step of filtering the plurality of data signals further comprises the step of filtering the plurality of data signals using at least one adaptive pattern recognition filter.

* * * * *